(12) United States Patent
Iiyama et al.

(10) Patent No.: US 8,558,967 B2
(45) Date of Patent: Oct. 15, 2013

(54) ILLUMINATING LENS, LIGHTING DEVICE, SURFACE LIGHT SOURCE, AND LIQUID-CRYSTAL DISPLAY APPARATUS

(75) Inventors: Tomoko Iiyama, Osaka (JP); Syunsuke Kimura, Hyogo (JP); Daizaburo Matsuki, Osaka (JP)

(73) Assignee: Panasonic Corporation, Osaka (JP)

( * ) Notice: Subject to any disclaimer, the term of this patent is extended or adjusted under 35 U.S.C. 154(b) by 430 days.

(21) Appl. No.: 12/704,813

(22) Filed: Feb. 12, 2010

(65) Prior Publication Data
US 2010/0201910 A1  Aug. 12, 2010

(30) Foreign Application Priority Data

Feb. 12, 2009 (JP) .................................. 2009-029350
Jun. 19, 2009 (JP) .................................. 2009-146767

(51) Int. Cl.
*G02F 1/1335* (2006.01)
*F21V 3/00* (2006.01)
*F21V 5/00* (2006.01)
*F21V 5/04* (2006.01)

(52) U.S. Cl.
USPC ............ 349/62; 349/64; 349/69; 362/311.02; 362/311.06; 362/327; 362/328; 362/329; 362/333; 362/334; 362/335

(58) Field of Classification Search
USPC ............. 349/62, 64, 69; 362/311.02, 311.06, 362/327–329, 333–336
See application file for complete search history.

(56) References Cited

U.S. PATENT DOCUMENTS 7,153,002 B2   12/2006  Kim et al.
7,348,723 B2    3/2008  Yamaguchi et al.
(Continued)

FOREIGN PATENT DOCUMENTS

JP    2004-087411 A    3/2004
JP    2005-011704      1/2005
(Continued)

OTHER PUBLICATIONS

Co-pending U.S. Appl. No. 12/705,016, filed Feb. 12, 2010.
(Continued)

*Primary Examiner* — Jessica M Merlin
(74) *Attorney, Agent, or Firm* — Hamre, Schumann, Mueller & Larson, P.C.

(57) ABSTRACT

A light exit surface of an illuminating lens has a first light exit surface and a second light exit surface. The first light exit surface is recessed toward a point on the optical axis, and the second light exit surface extends outwardly from the periphery of the first light exit surface. The first light exit surface has a transmissive region and a total reflection region. When the position of a light source on the optical axis is defined as a starting point, the transmissive region transmits light that has been emitted from the starting point at a relatively small angle with respect to the optical axis, and the total reflection region totally reflects light that has been emitted from the starting point at a relatively large angle with respect to the optical axis. A reflective layer is formed on a bottom surface that surrounds a light entrance surface and faces oppositely to the light exit surface. The reflective layer reflects light that has been emitted from the light source, totally reflected repeatedly at the light exit surface, and then reached the bottom surface.

14 Claims, 20 Drawing Sheets

(56) References Cited

U.S. PATENT DOCUMENTS

| | | | |
|---|---|---|---|
| 7,474,475 B2 | 1/2009 | Paek et al. | |
| 7,602,559 B2 | 10/2009 | Jang et al. | |
| 8,075,157 B2 | 12/2011 | Zhang et al. | |
| 2004/0246606 A1* | 12/2004 | Benitez et al. | 359/858 |
| 2004/0257826 A1 | 12/2004 | Tatsukawa | |
| 2005/0243577 A1 | 11/2005 | Moon | |
| 2006/0109669 A1 | 5/2006 | Tanaka et al. | |
| 2006/0119250 A1 | 6/2006 | Suehiro et al. | |
| 2006/0126343 A1* | 6/2006 | Hsieh et al. | 362/327 |
| 2006/0152932 A1 | 7/2006 | Wu | |
| 2006/0239020 A1 | 10/2006 | Albou | |
| 2007/0029563 A1 | 2/2007 | Amano et al. | |
| 2007/0047232 A1 | 3/2007 | Kim et al. | |
| 2007/0070530 A1* | 3/2007 | Seo et al. | 359/819 |
| 2007/0263390 A1 | 11/2007 | Timinger et al. | |
| 2008/0007673 A1 | 1/2008 | Shiraishi et al. | |
| 2008/0100773 A1 | 5/2008 | Hwang et al. | |
| 2008/0174996 A1 | 7/2008 | Lu et al. | |
| 2008/0278655 A1* | 11/2008 | Moon et al. | 349/58 |
| 2008/0303757 A1 | 12/2008 | Ohkawa et al. | |
| 2009/0052193 A1 | 2/2009 | Zweig et al. | |
| 2009/0109687 A1* | 4/2009 | Householder et al. | 362/309 |
| 2009/0268469 A1 | 10/2009 | Huang et al. | |
| 2009/0273727 A1 | 11/2009 | Kubota et al. | |
| 2010/0020264 A1 | 1/2010 | Ohkawa | |
| 2010/0053973 A1* | 3/2010 | Shastry et al. | 362/296.05 |
| 2010/0195335 A1* | 8/2010 | Allen et al. | 362/309 |

FOREIGN PATENT DOCUMENTS

| | | |
|---|---|---|
| JP | 2005-317977 A | 11/2005 |
| JP | 2006-005791 A | 1/2006 |
| JP | 2006-113556 A | 4/2006 |
| JP | 2006-147448 | 6/2006 |
| JP | 2006-252841 A | 9/2006 |
| JP | 2006-309242 A | 11/2006 |
| JP | 3875247 B2 | 11/2006 |
| JP | 2007-026702 | 2/2007 |
| JP | 2007-034307 A | 2/2007 |
| JP | 2007-048775 A | 2/2007 |
| JP | 2007-096318 A | 4/2007 |
| JP | 2007-102139 A | 4/2007 |
| JP | 2007-287479 | 11/2007 |
| JP | 2008-015288 | 1/2008 |
| JP | 2008-305923 A | 12/2008 |
| KR | 10-2006-0040502 | 5/2006 |
| WO | 2007/021149 | 2/2007 |

OTHER PUBLICATIONS

Co-pending U.S. Appl. No. 12/704,926, filed Feb. 12, 2010.
Co-pending U.S. Appl. No. 12/705,076, filed Feb. 12, 2010.
Co-pending U.S. Appl. No. 12/720,249, filed Mar. 9, 2010.

* cited by examiner ical Display Apparatus

ILLUMINATING LENS, LIGHTING DEVICE, SURFACE LIGHT SOURCE, AND LIQUID-CRYSTAL DISPLAY APPARATUS

BACKGROUND OF THE INVENTION

1. Field of the Invention

The present invention relates to an illuminating lens for widening a range of transmission directions for light from a light source such as a light emitting diode, and to a lighting device using this illuminating lens. The present invention further relates to a surface light source including a plurality of lighting devices, and to a liquid-crystal display apparatus in which this surface light source is disposed behind a liquid-crystal panel to serve as a backlight.

2. Description of Related Art

In a conventional backlight of a large-sized liquid-crystal display apparatus, a number of cold cathode tubes are disposed immediately below a liquid-crystal panel, and these cold cathode tubes are used with other members such as a diffusing plate and a reflecting plate. In recent years, light emitting diodes have been used as light sources for backlights. Light emitting diodes have increased their efficiency recently, and are expected to serve as low-power light sources to replace fluorescent lamps. In the case where light emitting diodes are used as a light source in a liquid-crystal display apparatus, the power consumption of the apparatus can be reduced by controlling the light and dark states of the light emitting diodes according to an image to be displayed.

In a backlight of a liquid-crystal display apparatus using light emitting diodes as a light source, a large number of light emitting diodes are disposed therein instead of cold cathode tubes. The use of a large number of light emitting diodes allows the entire surface of the backlight to have uniform brightness, but the need for such a large number of light emitting diodes is an obstacle to cost reduction. In view of this, attempts to increase the output power of each light emitting diode to reduce the required number of light emitting diodes have been made. For example, Japanese Patent No. 3875247 has proposed a lens that is designed to provide a uniform surface light source with a reduced number of light emitting diodes.

In order to obtain a uniform surface light source with a reduced number of light emitting diodes, the area to be irradiated with the light emitted from each light emitting diode needs to be increased. That is, light emitted from each light emitting diode needs to be spread to obtain a wider range of transmission directions for light from the diode. For this purpose, in Japanese Patent No. 3875247, a lens having a circular shape in a plan view is disposed on a light emitting diode as a chip to control the directivity of the chip. The light exit surface of this lens, through which light exits the lens, has a shape such that a portion in the vicinity of the optical axis is a concave and a portion surrounding the concave is a convex extending continuously from the concave.

On the other hand, JP 2008-305923 A has proposed a lens that is designed to provide a more uniform surface light source. In this lens, light that has been Fresnel reflected at the light exit surface of the lens back to the light entrance surface side thereof is reflected again by total reflection to be guided toward the surface to be irradiated.

A light emitting diode as a chip emits light mostly in the front direction of the light emitting diode chip. In the lens disclosed in Japanese Patent No. 3875247, light that has been emitted in the front direction of the chip is refracted at the concave surface in the vicinity of the optical axis and diffused. As a result, the surface to be irradiated is illuminated to have a wide illuminance distribution with a reduced illuminance in the vicinity of the optical axis.

In the lens disclosed in Japanese Patent No. 3875247, however, the light emitted from the light source needs to be refracted, and therefore the difference in height between the concave and the convex must be reduced to a certain level. That is, there is a limit to a widening of the range of transmission directions for light from the light source. The lens disclosed in JP 2008-305923 A has the same limit because it is designed to distribute the light emitted from the chip by utilizing the refraction of the light.

SUMMARY OF THE INVENTION

It is an object of the present invention to provide an illuminating lens capable of further widening the range of transmission directions for light from a light source, and to provide a lighting device, a surface light source, and a liquid-crystal display apparatus each including this illuminating lens.

In order to achieve the above object, the present inventors have considered it important, in obtaining a wider range of transmission directions for light from a light source, to distribute radially the intense light that has been emitted in the front direction of the light emitting diode chip, and come up with an idea of distributing radially the light emitted in the front direction of the light emitting diode chip by utilizing intentionally the total reflection of the light. Accordingly, the present inventors have conceived an illuminating lens described below.

That is, the illuminating lens is a lens for spreading light emitted from a light source so that a surface to be irradiated is irradiated with the spread light, and includes: a light entrance surface through which the light emitted from the light source enters the lens; and a light exit surface through which the light that has entered the lens exits the lens. The light exit surface has a first light exit surface and a second light exit surface. The first light exit surface is recessed toward a point on an optical axis of the illuminating lens, and the second light exit surface extends outwardly from a periphery of the first light exit surface to form a convex. The first light exit surface has a transmissive region located in the center of the first light exit surface and a total reflection region located around the transmissive region. When the position of the light source on the optical axis is defined as a starting point, the transmissive region transmits light that has been emitted from the starting point at a relatively small angle with respect to the optical axis and then reached the first light exit surface, and the total reflection region totally reflects light that has been emitted from the starting point at a relatively large angle with respect to the optical axis and then reached the first light exit surface. The second light exit surface has a shape capable of transmitting approximately the entire amount of light that has been emitted from the starting point and then reached the second light exit surface.

In the illuminating lens configured as described above, the range of transmission directions for light from the light source can be widened more by utilizing positively the total reflection of light. As shown in FIG. 27, in this illuminating lens, the light is totally reflected at the total reflection region of the first light exit surface in the light exit surface 112. Then, a part of the light again is totally reflected repeatedly at the second light exit surface extending outwardly from the first light exit surface, and reaches the bottom surface 113 that surrounds the light entrance surface 111 and faces oppositely to the light exit surface 112. The light that has reached the bottom surface 113 passes through the bottom surface 113, and then is reflected at the member 130 (for example, a substrate) that faces the bottom surface 113 to be guided toward the surface to be irradiated. In this case, the position on the surface to be irradiated reached by the light reflected from the member 130 is determined by the clearance between the bottom surface 113 and the member 130, but the cost for maintaining the clearance with a high degree of accuracy is high. For this reason, it is desired that the illuminance on the surface to be irradiated be stabilized with a lower cost configuration. The present invention has been made in view of the above circumstances.

The present invention provides an illuminating lens for spreading light emitted from a light source so that a surface to be irradiated is irradiated with the spread light. The lens includes: a light entrance surface through which the light emitted from the light source enters the lens; a light exit surface through which the light that has entered the lens exits the lens; and a bottom surface configured to surround the light entrance surface and to face oppositely to the light exit surface. In this illuminating lens, the light exit surface has a first light exit surface and a second light exit surface. The first light exit surface is recessed toward a point on an optical axis of the illuminating lens, and the second light exit surface extends outwardly from a periphery of the first light exit surface to form a convex. The first light exit surface has a transmissive region located in the center of the first light exit surface and a total reflection region located around the transmissive region. The transmissive region transmits light that has been emitted from a starting point at a relatively small angle with respect to the optical axis and then reached the first light exit surface, when a position of the light source on the optical axis is defined as the starting point. The total reflection region totally reflects light that has been emitted from the starting point at a relatively large angle with respect to the optical axis and then reached the first light exit surface. The second light exit surface has a shape capable of transmitting approximately the entire amount of light that has been emitted from the starting point and then reached the second light exit surface, and of totally reflecting approximately the entire amount of the light that has been totally reflected at the total reflection region and then reached the second light exit surface. A reflective layer is formed on the bottom surface to reflect light that has been emitted from the light source, totally reflected repeatedly at the light exit surface, and then reached the bottom surface.

Herein, "approximately the entire amount" means at least 90% of the entire amount. It may be the entire amount, and may be an amount slightly smaller than the entire amount.

The present invention also provides a lighting device including: a light emitting diode for emitting light; and an illuminating lens for spreading light emitted from the light emitting diode so that a surface to be irradiated is irradiated with the spread light. This illuminating lens is the above-mentioned illuminating lens.

The present invention further provides a surface light source including: a plurality of lighting devices arranged in a plane; and a diffusing plate disposed to cover the plurality of lighting devices, and configured to receive on one surface thereof light emitted from the plurality of lighting devices and to emit the light from the other surface thereof in a diffused manner. Each of the plurality of lighting devices is the above-mentioned lighting device.

The present invention still further provides a liquid-crystal display apparatus including: a liquid-crystal panel; and the above-mentioned surface light source disposed behind the liquid-crystal panel.

According to the present invention, it is possible not only to obtain a wider range of transmission directions for light from the light source but also to stabilize the illuminance of the surface to be irradiated with a low cost configuration in which a reflective layer is formed on the bottom surface.

DETAILED DESCRIPTION OF THE INVENTION

First Embodiment

Figure 1:
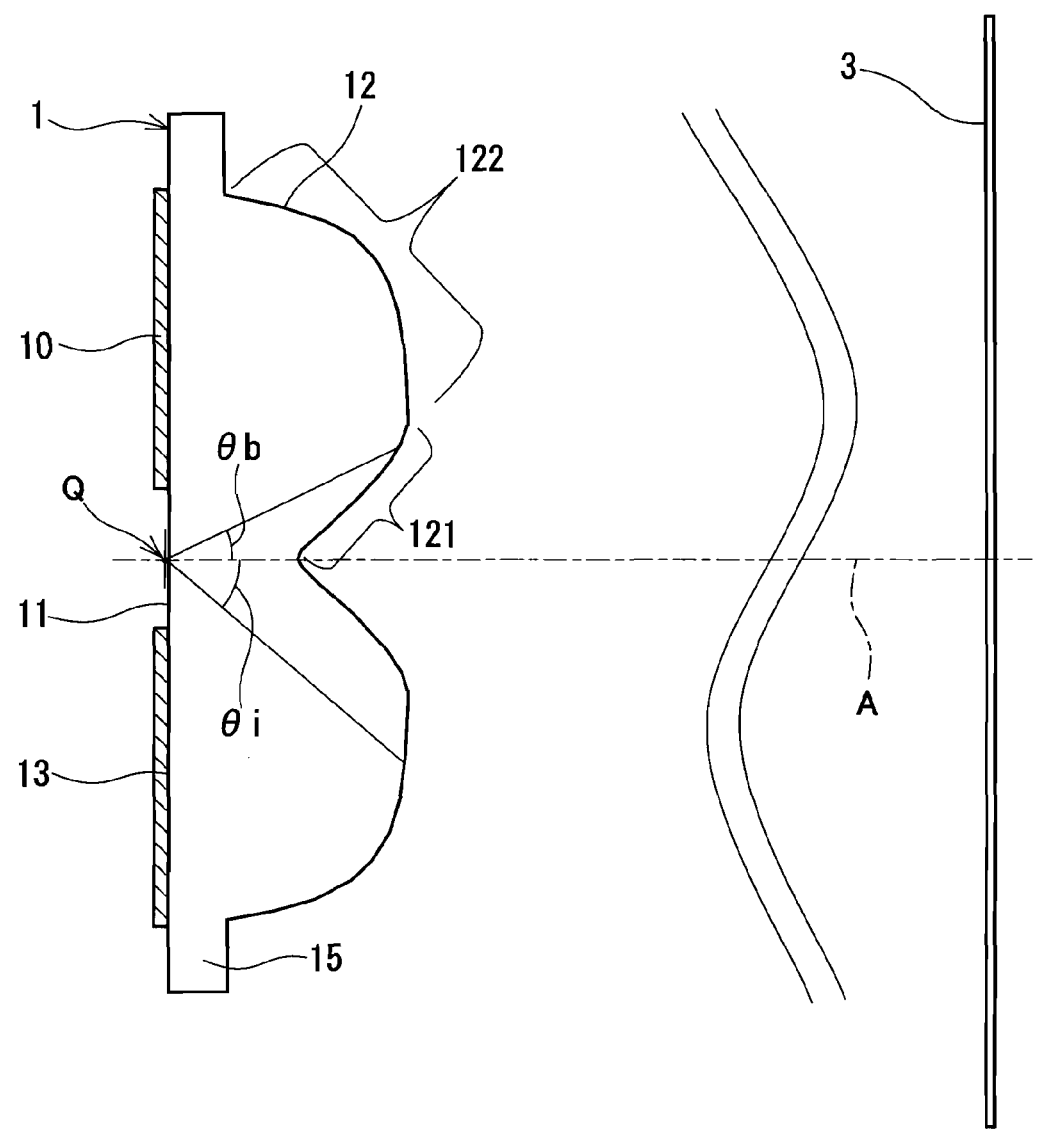
FIG. 1 is a schematic diagram of an illuminating lens according to a first embodiment of the present invention.

An illuminating lens according to the first embodiment of the present invention will be described with reference to the accompanying drawings. FIG. 1 is a schematic diagram of an illuminating lens 1 according to the first embodiment. The illuminating lens 1, which is disposed between a light source (not shown in FIG. 1) having directivity and a surface to be irradiated 3, spreads light emitted from the light source and emits the spread light to the surface to be irradiated 3. That is, the illuminating lens 1 widens the range of transmission directions for light from the light source. In the illuminance distribution on the surface to be irradiated 3, the illuminance is greatest on the optical axis A that is the design center line of the illuminating lens 1 and decreases almost monotonically toward the edge. The light source and the illuminating lens 1 are disposed so that their optical axes coincide with each other.

Specifically, the illuminating lens 1 has a light entrance surface 11 through which the light emitted from the light source enters the lens and a light exit surface 12 through which the light that has entered the lens exits the lens. The illuminating lens 1 has a bottom surface 13 surrounding the light entrance surface 11 and facing oppositely to the light exit surface 12. Furthermore, in the present embodiment, a radially outwardly projecting ring portion 15 is provided between the light exit surface 12 and the bottom surface 13. The periphery of the light exit surface 12 is joined to the outer edge of the bottom surface 13 via the outer surface of the ring portion 15 having an approximately U-shaped cross section. The ring portion 15 may be omitted. In this case, the periphery of the light exit surface 12 may be joined to the outer edge of the bottom surface 13 with an end face having a straight or arcuate cross section.

Figure 25:
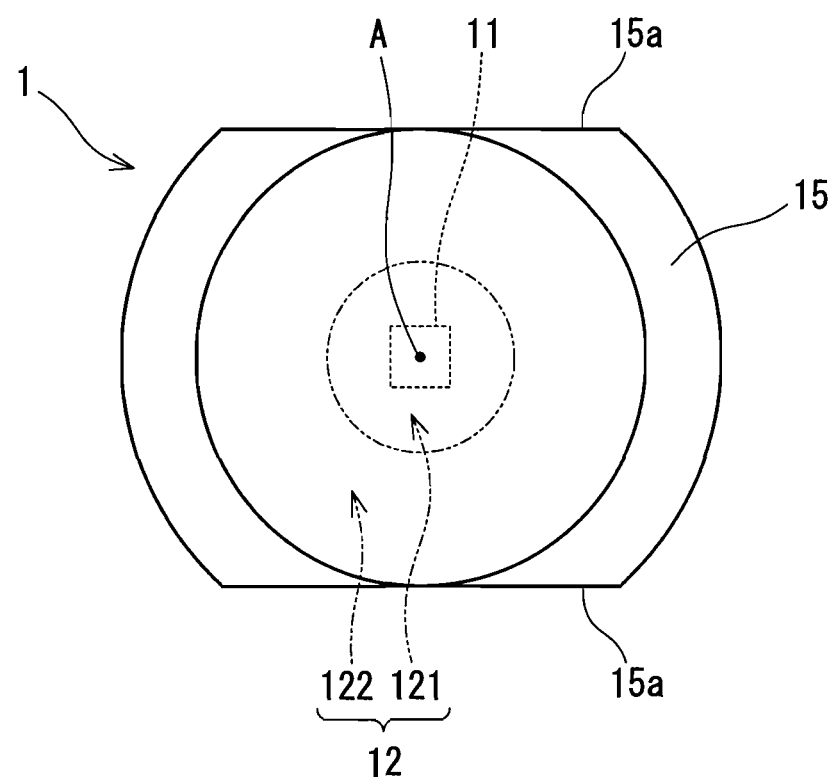
FIG. 25 is a plan view of a modified illuminating lens.

In the present embodiment, the light exit surface 12 is axisymmetric with respect to the optical axis A. The contour of the illuminating lens 1 in plan view need not be axisymmetric with respect to the optical axis A. For example, as shown in FIG. 25, the illuminating lens 1 may have an oval shape, in which the ring portion 15 has a pair of flat portions 15a that are parallel to each other across the optical axis A, when viewed from the optical axis direction.

The light entrance surface 11 need not be axisymmetric with respect to the optical axis A. In the present embodiment, the region that is connected optically to the light source is the light entrance surface 11. Preferably, the annular bottom surface 13 surrounding the light entrance surface 11 is flat. In FIG. 1, the light entrance surface 11 and the bottom surface 13 are on the same level, but there may be a level difference between the light entrance surface 11 and the bottom surface 13. For example, the illuminating lens 1 may be configured such that the light entrance surface 11 is located closer to the light exit surface 12 than the bottom surface 13 and the light source is fitted in the recess formed by the level difference between the surfaces 11 and 13. The light entrance surface 11 need not necessarily be joined directly to the light source. For example, the light entrance surface 11 may be recessed in a hemispherical shape so that an air space is formed between the light entrance surface 11 and the light source.

The light emitted from the light source enters the illuminating lens 1 through the light entrance surface 11, exits the lens 1 through the light exit surface 12, and then reaches the surface to be irradiated 3. The light emitted from the light source is spread by the action of the light exit surface 12, and reaches a large area of the surface to be irradiated 3.

As the light source, for example, a light emitting diode can be used. Light emitting diodes usually are chips with a rectangular plate shape. Therefore, it is preferable that the light entrance surface 11 of the illuminating lens 1 have a shape conforming to the shape of a light emitting diode to fit in close contact with the light emitting diode. The light emitting diode is in contact with the light entrance surface 11 of the illuminating lens 1 via a bonding agent, and connected optically to the light entrance surface 11. The light emitting diode usually is covered with a sealing resin to avoid contact with air. As a conventional sealing resin for a light emitting diode, an epoxy resin, silicone rubber, or the like is used.

The illuminating lens 1 is made of a transparent material having a specified refractive index. The refractive index of the transparent material is, for example, about 1.4 to 1.5. Examples of such a transparent material include resins such as epoxy resin, silicone resin, acrylic resin, and polycarbonate, and rubbers such as silicone rubber. Particularly, it is preferable to use epoxy resin, silicone rubber, or the like that has been used as a sealing resin for a light emitting diode.

The light exit surface 12 includes a first light exit surface 121 that is recessed toward a point on the optical axis A, and a second light exit surface 122 extending radially outwardly from the periphery of the first light exit surface 121 to form a convex. Light enters the illuminating lens 1 through the light entrance surface 11 at a wide range of angles. Light that has entered the lens at a small angle with respect to the optical axis A reaches the first light exit surface 121, and light that has entered the lens at a larger angle with respect to the optical axis A reaches the second light exit surface 122.

Next, the shapes of the first light exit surface 121 and the second light exit surface 122 will be described. For that purpose, a starting point Q is defined first, and then light emitted from the starting point Q is assumed. As stated herein, the starting point Q is the position of the light source on the optical axis A. In the case where a light emitting diode is used as a light source, the starting point Q is the point of intersection of the optical axis A and the light emitting surface that is the front surface of the light emitting diode. That is, the starting point Q is spaced from the light entrance surface 11 by the thickness of the above-mentioned bonding agent. When an angle between the optical axis A and a line connecting the starting point Q and the boundary between the first light exit surface 121 and the second light exit surface 122 is θb, light that has been emitted from the starting point Q at an angle reaches the first light exit surface 121 or the second light exit surface 122 based on the angle θb as a threshold angle.

Figure 2:
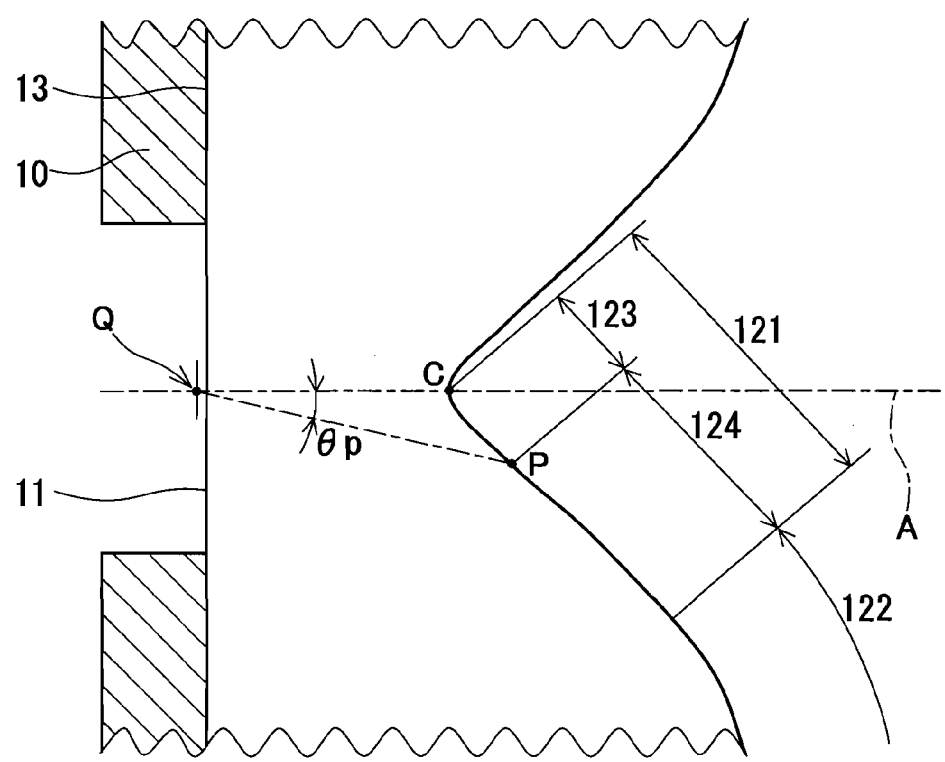
FIG. 2 is an enlarged view of the main portions of FIG. 1.

As shown in FIG. 2, the first light exit surface 121 includes a transmissive region 123 located in the center of the first light exit surface 121 and a total reflection region 124 located around the transmissive region 123. The transmissive region 123 transmits light that has been emitted from the starting point Q at a relatively small angle of less than a specified value of θp with respect to the optical axis A and reached the first light exit surface 121, and the total reflection region 124 totally reflects light that has been emitted from the starting point Q at a relatively large angle of θp or more with respect to the optical axis A and reached the first light exit surface 121. That is, θp is an angle between the optical axis A and a line connecting a point P and the starting point Q, when the point P is a point on the boundary between the transparent region 123 and the total reflection region 124.

On the other hand, the second light exit surface 122 has a shape capable of transmitting approximately the entire amount of light that has been emitted from the starting point Q and reached the second light exit surface 122, and totally reflecting approximately the entire amount of the light that has been totally reflected at the total reflection region 124 and reached the second light exit surface 122. The angle between the optical axis A and the light emitted from the starting point Q increases toward the outer edge of the second light exit surface 122. The angle of the light emitted from the starting point Q with respect to a normal line at the point on the second light exit surface 122 reached by the emitted light is the incident angle of the light with respect to the second light exit surface 122. An excessively large incident angle causes total reflection. The incident angle needs to be kept small in order to prevent total reflection. Accordingly, the second light exit surface 122 has a shape such that the angle between the normal line and the optical axis A increases with increasing distance from the optical axis A. That is, the shape of the second light exit surface 122 is a convex.

The entire second light exit surface 122 need not necessarily transmit the light emitted from the starting point Q (i.e., the second light exit surface 122 need not transmit the entire amount of the light). The second light exit surface 122 may have a shape capable of totally reflecting a part of the light emitted from the starting point Q and transmitting the remaining part of the light.

Furthermore, in the present embodiment, an annular reflective layer 10 is formed on the bottom surface 13, as shown in FIG. 1. Preferably, the reflective layer 10 has a ring shape extending radially outwardly from the optical axis A. The light emitted from the light source is totally reflected at the total reflection region 124 of the first light exit surface 121 and then reaches the second light exit surface 122 (see FIG. 5). A part of the light that has reached the second light exit surface 122 passes through the second light exit surface 122, but most of the remaining part of the light is totally reflected one or more times again at the second light exit surface 122. The light travels along the second light exit surface 122 while being totally reflected one or more times again at the second light exit surface 122, and then reaches the bottom surface 13. The reflective layer 10 reflects the light that has reached the bottom surface 13 in this way. That is, the reflective layer 10 reflects the light that has been totally reflected repeatedly at the light exit surface 12 (i.e., the total reflection region 124 of the first light exit surface 121 and the second light exit surface 122) and then reached the bottom surface 13.

The reflective layer 10 may be formed of a reflective film obtained by applying a reflective material on the bottom surface 13 and curing the material. The reflective layer 10 also may be formed of a reflective sheet attached to the bottom surface 13. Preferably, the reflective layer 10 has a reflectance of at least 65%. This is because a reflectance of less than 65% increases the loss of light in the reflective layer 10, which causes a decrease in irradiation efficiency and an uneven illuminance.

In the illuminating lens 1 configured as described above, the most part of the light that has been emitted from the light source and reached the transmissive region 123 located in the center of the first light exit surface 121 is refracted at the transmissive region 123, and thus the area surrounding the optical axis A of the lens on the surface to be irradiated 3 is irradiated with the refracted light. On the other hand, the most part of the light that has been emitted from the light source and reached the total reflection region 124 located on the peripheral side of the first light exit surface 121 is totally reflected at the total reflection region 124. The most part of the totally reflected light reaches the bottom surface 13, is reflected at the reflective layer 10, and then the surface to be irradiated 3 is irradiated with the reflected light. Furthermore, the most part of the light that has been emitted from the light source and reached the second light exit surface 122 is refracted at the second light exit surface 122, and thus the area away from the optical axis A of the lens on the surface to be irradiated 3 is irradiated with the refracted light. Accordingly, the illuminating lens 1 of the present embodiment allows the range of transmission directions for light from the light source to be widened further. Therefore, the outer diameter of the lens of the present embodiment may be smaller than that of a conventional lens having a concave for only refracting light.

Furthermore, in the present embodiment, the light that has reached the bottom surface 13 can be guided definitely toward the surface to be irradiated 3 with a low cost configuration in which the reflective layer 10 is formed on the bottom surface 13. As a result, the illuminance of the surface to be irradiated 3 can be stabilized.

The basic configuration of the illuminating lens 1 of the present embodiment has been described so far. A preferable configuration of the illuminating lens 1 of the present embodiment will be described below.

Preferably, the reflective layer 10 has a circular annular shape, and satisfies the following inequalities (1) and (2).

$$R_{LS}/R < R_{in}/R < 0.78 \tag{1}$$

$$0.75 < R_{out}/R \tag{2}$$

where $R_{in}$ is an internal radius of the reflective layer, $R_{out}$ is an outer radius of the reflective layer, $R_{LS}$ is a radius of a smallest circle circumscribing the light source, and R is an outermost radius of the illuminating lens.

These inequalities (1) and (2) define the proportion of the area of the reflective layer 10 on the bottom surface 13, and indicate the range of proportions for controlling suitably the amount of light directed to the surface to be irradiated 3. As for the inequality (1), when the value of $R_{in}/R$ is smaller than that of $R_{LS}/R$, the reflective layer intrudes between the lens and the light source, which causes a decrease in the amount of light emitted from the light source. In the case where the reflective layer is a reflective sheet, if the diameter of the hole in the sheet is small, the sheet cannot be attached properly to the bottom surface of the lens. In such a case, air enters the space between the lens and the light source and good optical contact cannot be obtained due to a twist of the sheet, or the lens is decentered when the sheet is attached, which causes an uneven illuminance. When $R_{in}/R$ is 0.78 or more, the reflective layer has less effect on light, and cannot control the decrease in irradiation efficiency and uneven illuminance. As for the inequality (2), when $R_{out}/R$ is 0.75 or less, the reflective layer has less effect on light, and cannot control the decrease in irradiation efficiency and uneven illuminance.

The reflective layer 10 may reflect specularly the light that has reached the bottom surface 13, but preferably, it diffusely reflects the light that has reached the bottom surface 13. With such a configuration, the illuminance can be adjusted easily by utilizing the reflective properties of the reflective layer 10.

The illuminating lens of the present invention also is applicable to light sources (such as lasers and organic ELs) as well as light emitting diodes.

Figure 26A:
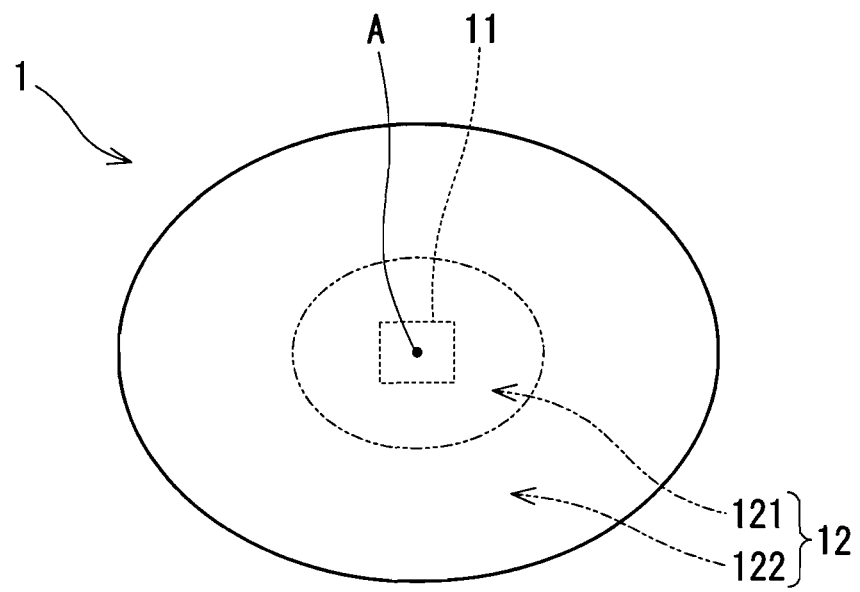
FIG. 26A and FIG. 26B are each a plan view of an illuminating lens of another embodiment.
Figure 26B:
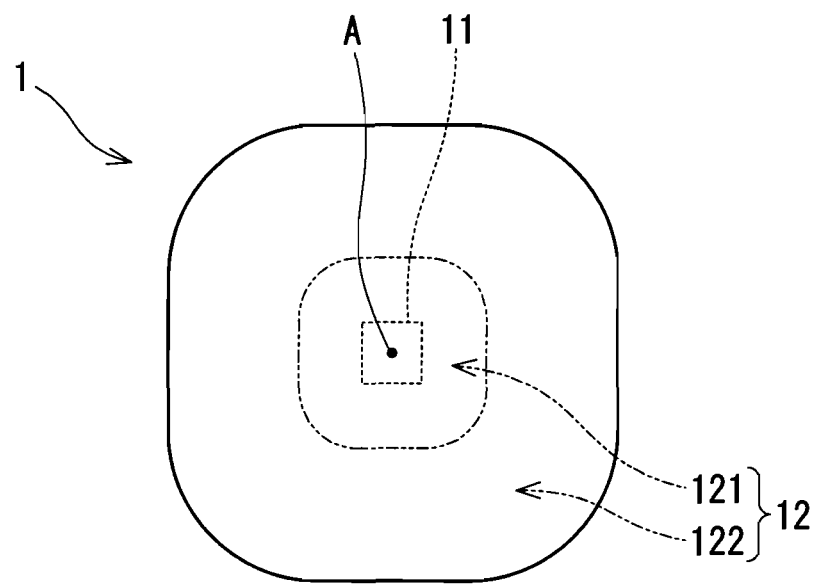
Figure 27:
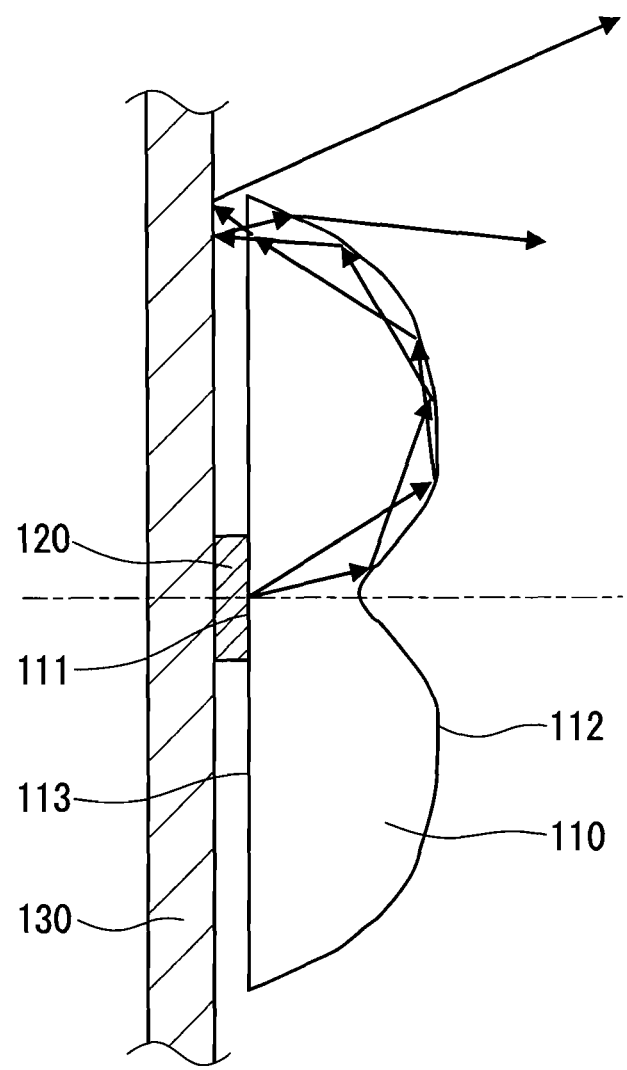
FIG. 27 is a schematic diagram of an illuminating lens that has been conceived before.

In the present embodiment, the light exit surface 12 is axisymmetric with respect to the optical axis A. The light exit surface 12, however, need not be axisymmetric with respect to the optical axis A. For example, as shown in FIG. 26A, the light exit surface 12 may have an elliptical shape when viewed from the optical axis direction. This illuminating lens 1 is suitable particularly for an elongated light source. Alternatively, as shown in FIG. 26B, the light exit surface 12 may have a rounded rectangular shape when viewed from the optical axis direction.

Second Embodiment

Figure 3:
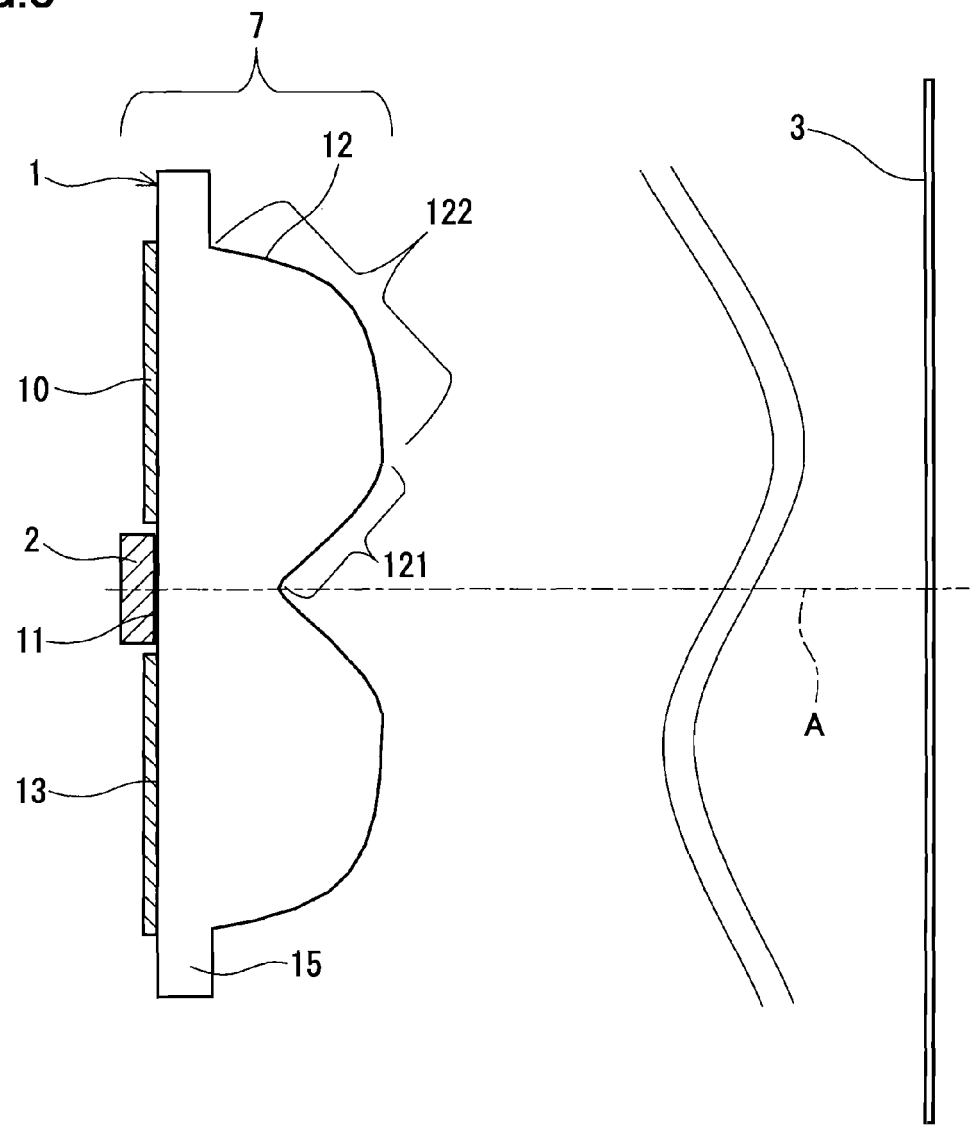
FIG. 3 is a schematic diagram of a lighting device according to a second embodiment of the present invention.

FIG. 3 is a schematic diagram of a lighting device 7 according to a second embodiment of the present invention. This lighting device 7 includes a light emitting diode 2 for emitting light, and an illuminating lens 1 of the first embodiment for spreading light emitted from the light emitting diode 2 so that the surface to be irradiated 3 is irradiated with the spread light.

The light emitting diode 2 is in contact with the light entrance surface 11 of the illuminating lens 1 via a bonding agent, and connected optically to the light entrance surface 11. The light that has exited the illuminating lens 1 through the light exit surface 12 reaches the surface to be irradiated 3, and thus the surface to be irradiated 3 is illuminated with that light.

Light generation in the light emitting diode 2 has no directivity in itself, and a light emitting region has a refractive index of at least 2.0. When light from the light emitting region enters a low refractive region, the refraction of the light at the interface causes the light to have the maximum intensity in the normal direction of the interface and to have a lower intensity as the angle of the light with respect to the normal line increases. As described above, since the light emitting diode 2 has high directivity, it is necessary to widen the range of transmission directions for light therefrom using the illuminating lens 1 to illuminate a larger area.

Figure 4:
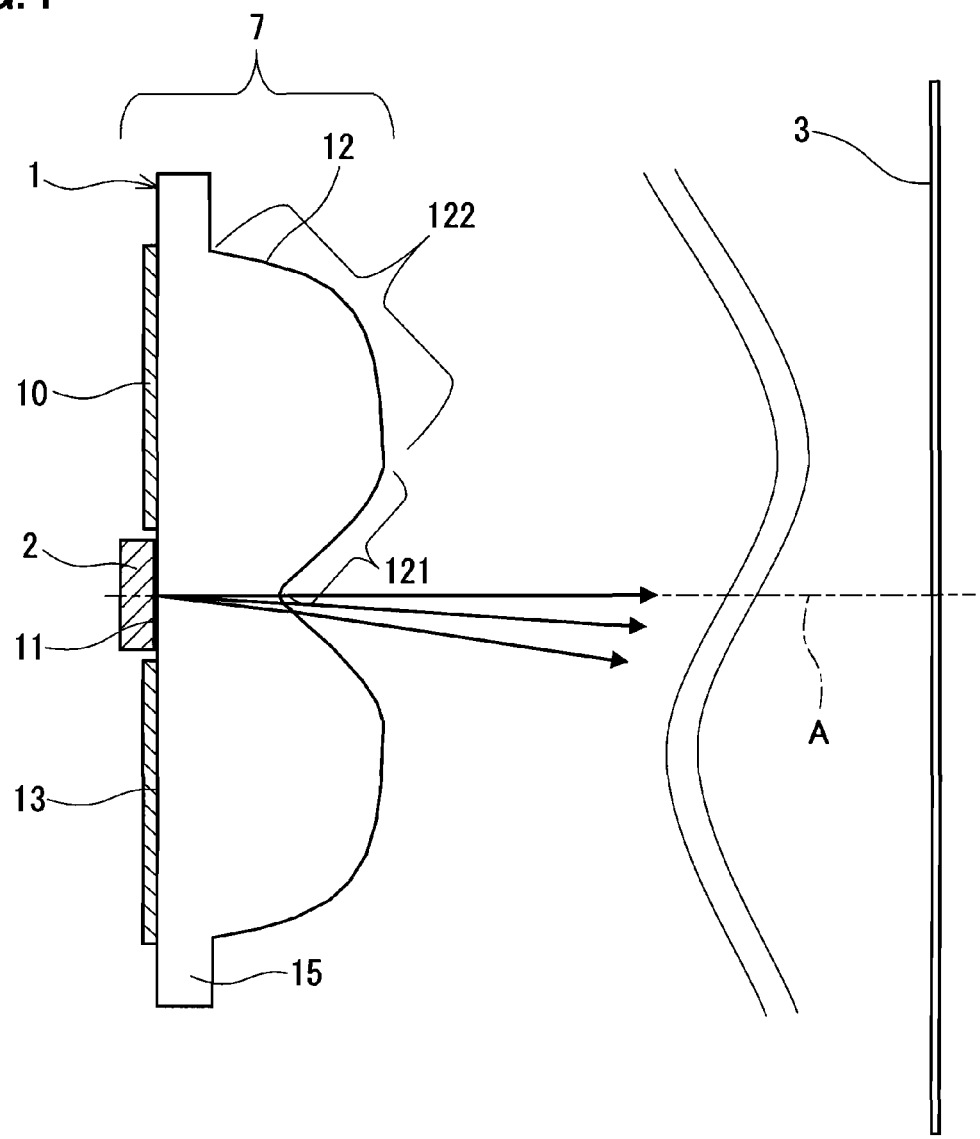
FIG. 4 is a diagram showing optical paths of light rays that reach a transmissive region of a first light exit surface of the lighting device according to the second embodiment of the present invention.

FIG. 4 is a diagram showing the paths of light rays in the lighting device 7. In FIG. 4, the paths of light rays that are emitted from the light source at small angles and reach the transmissive region 123 (see FIG. 2) of the first light exit surface 121 are described. The light that has been emitted from the light emitting diode 2 passes through the light entrance surface 11 and reaches the transmissive region 123 of the first light exit surface 121. The light that has reached the transmissive region 123 of the first light exit surface 121 passes through the transmissive region 123 while being refracted, and then reaches the surface to be irradiated 3.

Figure 5:
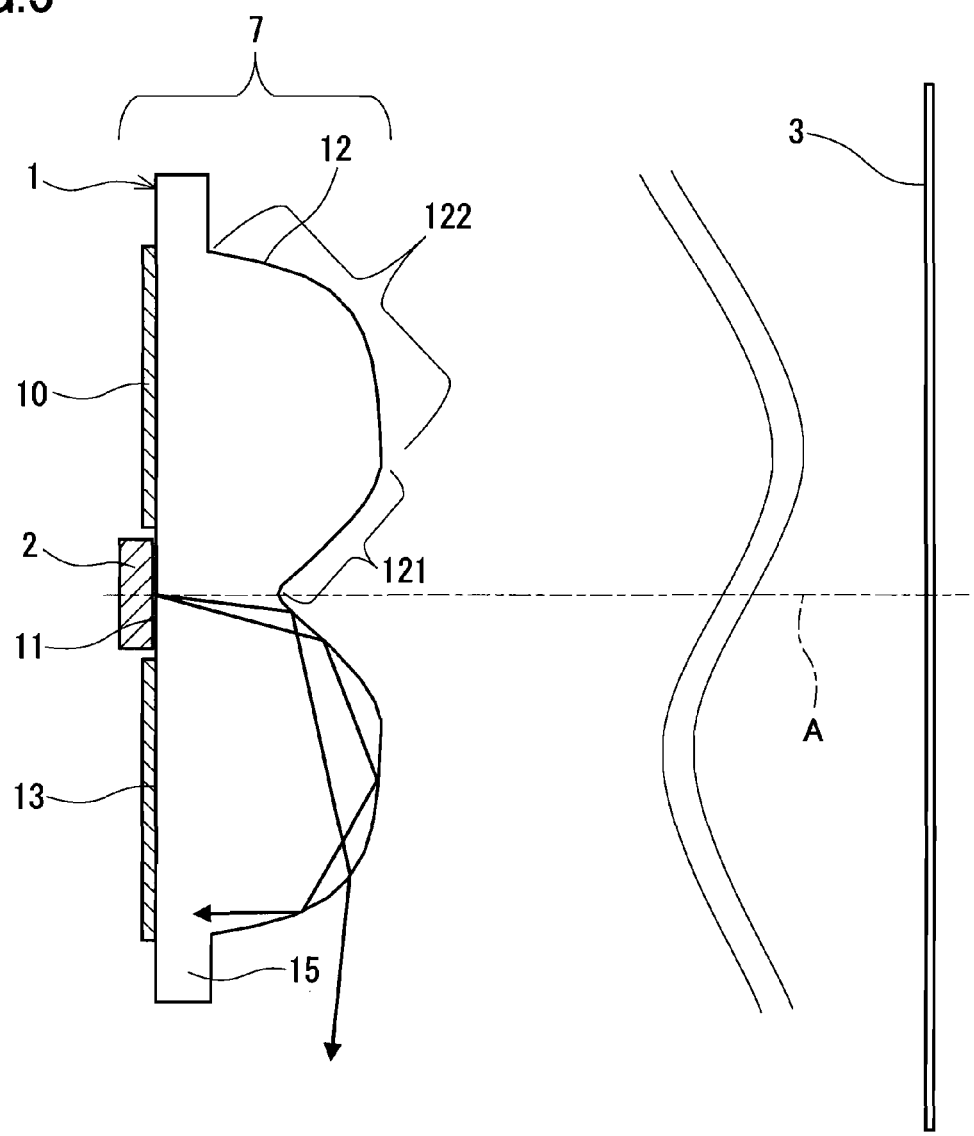
FIG. 5 is a diagram showing optical paths of light rays that reach a total reflection region of a first light exit surface of the lighting device according to the second embodiment of the present invention.

FIG. 5 is a diagram showing the paths of light rays in the lighting device 7. In FIG. 5, the paths of light rays that are emitted from the light source at small angles and reach the total reflection region 124 (see FIG. 2) of the first light exit surface 121 are described. The light that has been emitted from the light emitting diode 2 passes through the light entrance surface 11 and reaches the total reflection region 124 of the first light exit surface 121. The light that has reached the total reflection region 124 of the first light exit surface 121 is totally reflected at the total reflection region 124. The light that has traveled near the optical axis A is totally reflected to reach the second light exit surface 122, and then passes through the second light exit surface 122 while being refracted. In the case where a reflecting plate is provided on the side of the light entrance surface 11 of the illuminating lens 1, approximately the entire amount of light that has passed through the second light exit surface 122 reaches the surface to be irradiated 3. On the other hand, the light that has traveled away from the optical axis A is totally reflected to reach the second light exit surface 122, and then totally reflected at the second light exit surface 122 one or more times and reaches the bottom surface 13. Then, the light is reflected at the reflective layer 10, and at last, the surface to be irradiated 3 is irradiated with the reflected light.

Figure 6:
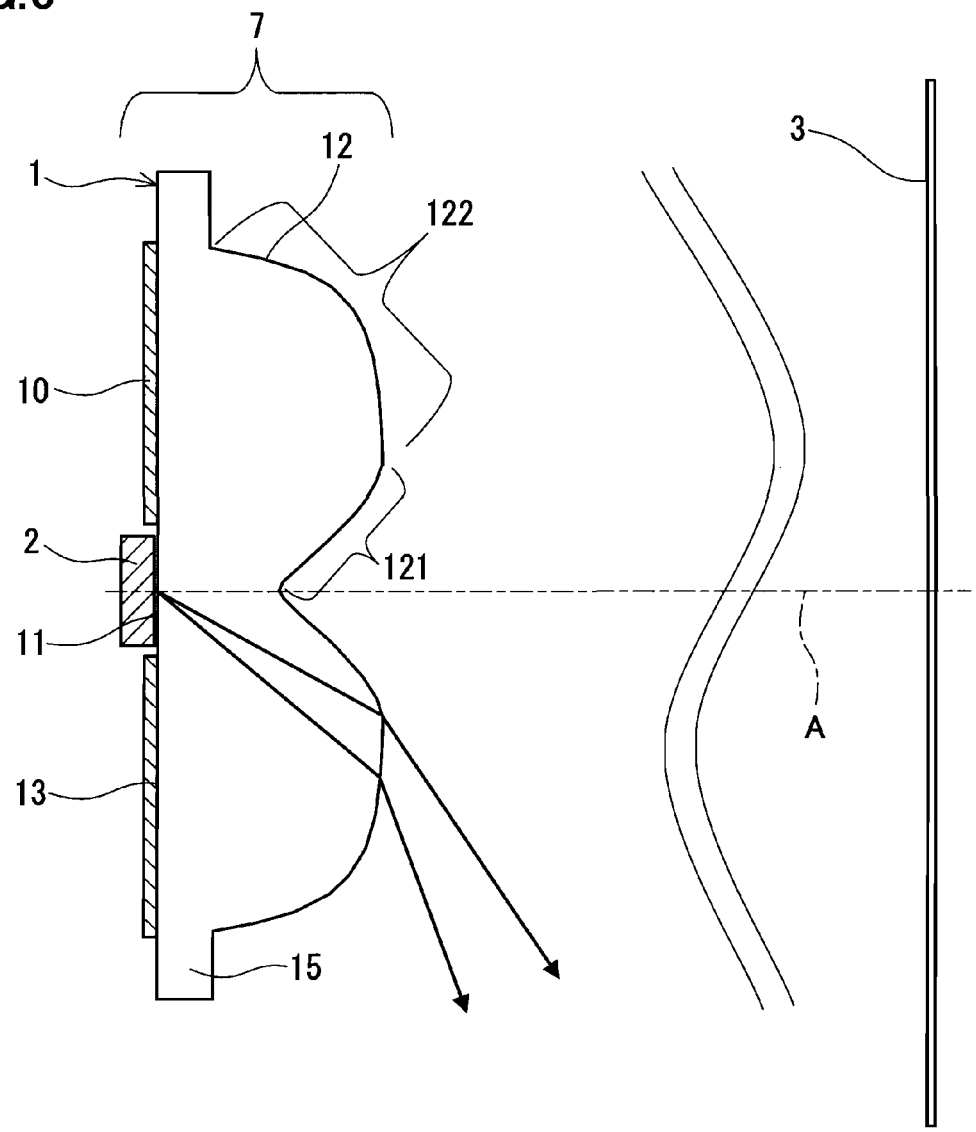
FIG. 6 is a diagram showing optical paths of light rays that exist the lighting device through a second light exit surface thereof according to the second embodiment of the present invention.

FIG. 6 is a diagram showing the paths of light rays in the lighting device 7. In FIG. 6, the paths of light rays that are emitted from the light source at larger angles and reach the second light exit surface 122 are described. The light that has been emitted from the light emitting diode 2 passes through the light entrance surface 11 and reaches the second light exit surface 122. In the case where the second light exit surface 122 does not have a shape capable of totally reflecting a part of the light, approximately the entire amount of the light that has reached the second light exit surface 122 passes through the second light exit surface 122 while being refracted, and then reaches the surface to be irradiated 3.

Hereinafter, Examples 1 to 3 are given as specific numerical examples of the present invention.

Figure 7:
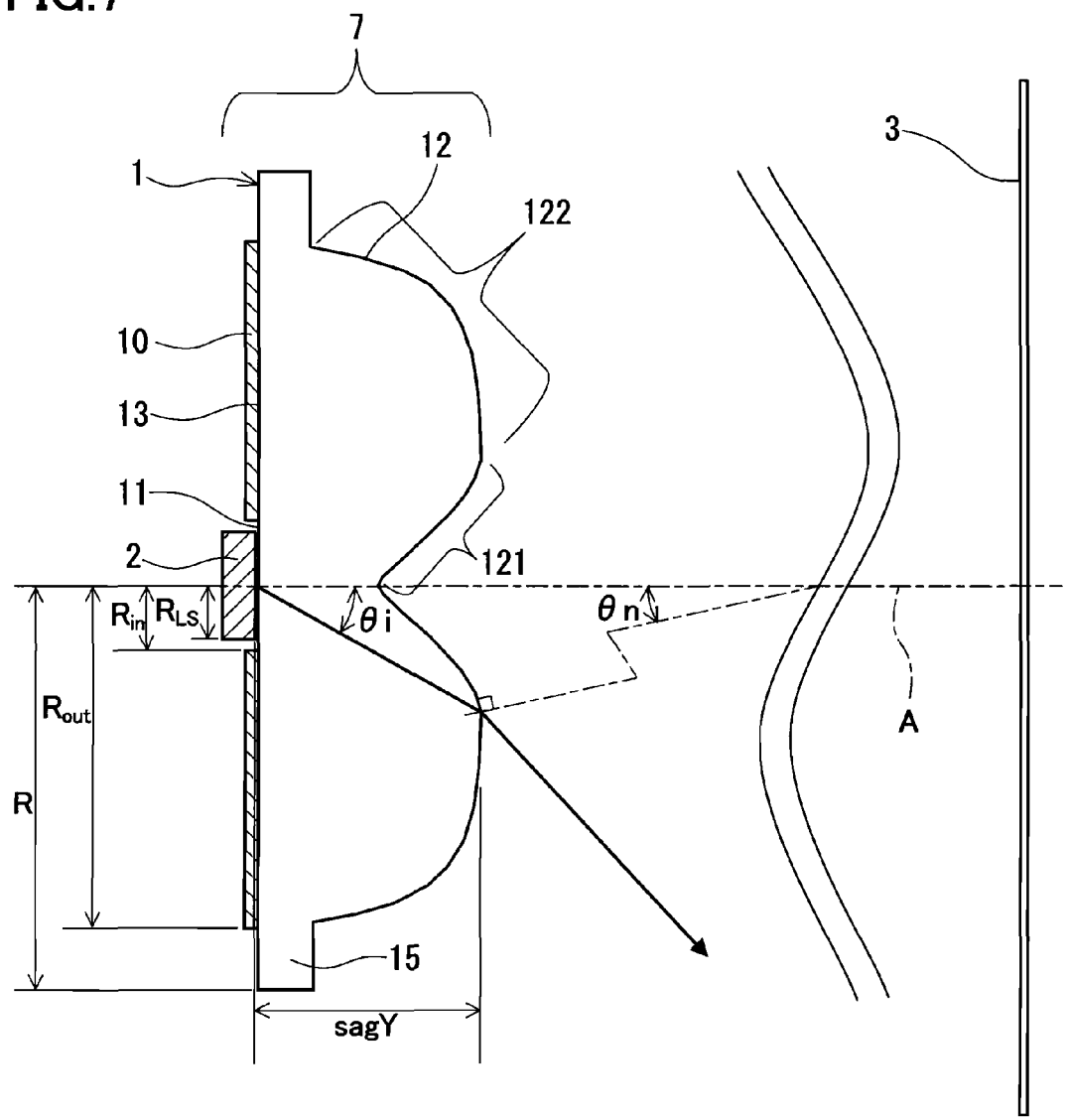
FIG. 7 is a diagram for explaining Examples 1 to 3 of the lighting device according to the second embodiment of the present invention.

FIG. 7 is a schematic diagram of a lighting device in Examples 1 to 3 according to the second embodiment of the present invention. Examples 1 to 3 are examples of a lighting device designed to widen the range of transmission directions for light from a 0.8 mm cubic-shaped light emitting diode as a light source. In FIG. 7, $\theta i$ is an angle between the optical axis A and a straight line connecting the position of the light source (starting point Q) on the optical axis A and an arbitrary point on the light exit surface 12. In FIG. 7, $\theta n$ is an angle between the optical axis A and a normal line at the arbitrary point on the light exit surface 12, that is, a normal line at a position on the light exit surface 12 reached by the light that has been emitted from the light source position (starting point Q) on the optical axis A at an angle of $\theta i$. Furthermore, in FIG. 7, sagY is a distance along the optical axis A between the light source position (starting point Q) on the optical axis A and the arbitrary point on the light exit surface 12.

Example 1

Table 1 below shows specific numerical values in Example 1.

TABLE 1

| $\theta i$ | sagY |
|---|---|
| 0.000 | 2.362 |
| 0.521 | 2.364 |
| 1.039 | 2.370 |
| 1.552 | 2.380 |
| 2.059 | 2.392 |
| 2.558 | 2.406 |
| 3.050 | 2.421 |

TABLE 1-continued

| θ i | sagY |
|---|---|
| 3.533 | 2.438 |
| 4.008 | 2.455 |
| 4.475 | 2.473 |
| 4.933 | 2.491 |
| 5.384 | 2.509 |
| 5.827 | 2.528 |
| 6.262 | 2.547 |
| 6.689 | 2.567 |
| 7.109 | 2.586 |
| 7.521 | 2.605 |
| 7.927 | 2.625 |
| 8.325 | 2.645 |
| 8.717 | 2.664 |
| 9.102 | 2.684 |
| 9.480 | 2.704 |
| 9.853 | 2.723 |
| 10.219 | 2.743 |
| 10.579 | 2.763 |
| 10.934 | 2.782 |
| 11.283 | 2.802 |
| 11.627 | 2.821 |
| 11.966 | 2.840 |
| 12.300 | 2.860 |
| 12.629 | 2.879 |
| 12.954 | 2.898 |
| 13.275 | 2.916 |
| 13.591 | 2.935 |
| 13.904 | 2.953 |
| 14.212 | 2.971 |
| 14.517 | 2.989 |
| 14.819 | 3.007 |
| 15.118 | 3.024 |
| 15.413 | 3.041 |
| 15.706 | 3.058 |
| 15.995 | 3.075 |
| 16.282 | 3.092 |
| 16.567 | 3.108 |
| 16.849 | 3.124 |
| 17.129 | 3.139 |
| 17.407 | 3.155 |
| 17.683 | 3.170 |
| 17.957 | 3.184 |
| 18.229 | 3.199 |
| 18.499 | 3.213 |
| 18.768 | 3.227 |
| 19.035 | 3.240 |
| 19.301 | 3.254 |
| 19.566 | 3.267 |
| 19.829 | 3.279 |
| 20.091 | 3.292 |
| 20.351 | 3.304 |
| 20.611 | 3.316 |
| 20.869 | 3.327 |
| 21.127 | 3.339 |
| 21.383 | 3.350 |
| 21.638 | 3.360 |
| 21.892 | 3.371 |
| 22.145 | 3.381 |
| 22.397 | 3.391 |
| 22.648 | 3.401 |
| 22.898 | 3.410 |
| 23.147 | 3.420 |
| 23.395 | 3.429 |
| 23.642 | 3.438 |
| 23.887 | 3.447 |
| 24.132 | 3.455 |
| 24.376 | 3.464 |
| 24.618 | 3.472 |
| 24.859 | 3.480 |
| 25.100 | 3.488 |
| 25.338 | 3.496 |
| 25.576 | 3.504 |
| 25.813 | 3.512 |
| 26.048 | 3.519 |
| 26.282 | 3.526 |
| 26.515 | 3.534 |
| 26.746 | 3.541 |
| 26.976 | 3.548 |
| 27.205 | 3.555 |
| 27.433 | 3.562 |
| 27.659 | 3.569 |
| 27.884 | 3.576 |
| 28.108 | 3.582 |
| 28.331 | 3.589 |
| 28.553 | 3.596 |
| 28.774 | 3.602 |
| 28.994 | 3.608 |
| 29.213 | 3.614 |
| 29.431 | 3.620 |
| 29.649 | 3.626 |
| 29.867 | 3.632 |
| 30.084 | 3.637 |
| 30.301 | 3.642 |
| 30.519 | 3.647 |
| 30.737 | 3.652 |
| 30.955 | 3.656 |
| 31.175 | 3.660 |
| 31.395 | 3.664 |
| 31.618 | 3.667 |
| 31.842 | 3.670 |
| 32.069 | 3.672 |
| 32.298 | 3.673 |
| 32.531 | 3.674 |
| 32.767 | 3.674 |
| 33.008 | 3.674 |
| 33.253 | 3.672 |
| 33.504 | 3.670 |
| 33.762 | 3.667 |
| 33.953 | 3.672 |
| 34.176 | 3.673 |
| 34.397 | 3.674 |
| 34.616 | 3.675 |
| 34.833 | 3.677 |
| 35.048 | 3.678 |
| 35.261 | 3.679 |
| 35.473 | 3.681 |
| 35.684 | 3.682 |
| 35.892 | 3.684 |
| 36.100 | 3.685 |
| 36.306 | 3.687 |
| 36.511 | 3.689 |
| 36.715 | 3.690 |
| 36.918 | 3.692 |
| 37.120 | 3.693 |
| 37.321 | 3.694 |
| 37.521 | 3.696 |
| 37.720 | 3.697 |
| 37.919 | 3.698 |
| 38.117 | 3.699 |
| 38.315 | 3.700 |
| 38.512 | 3.701 |
| 38.708 | 3.702 |
| 38.905 | 3.703 |
| 39.101 | 3.704 |
| 39.296 | 3.704 |
| 39.492 | 3.705 |
| 39.687 | 3.705 |
| 39.882 | 3.705 |
| 40.077 | 3.705 |
| 40.273 | 3.705 |
| 40.468 | 3.705 |
| 40.663 | 3.704 |
| 40.858 | 3.704 |
| 41.053 | 3.703 |
| 41.249 | 3.702 |
| 41.444 | 3.701 |
| 41.640 | 3.700 |
| 41.836 | 3.698 |
| 42.032 | 3.697 |
| 42.229 | 3.695 |
| 42.425 | 3.693 |
| 42.622 | 3.691 |
| 42.819 | 3.689 |
| 43.017 | 3.687 |
| 43.214 | 3.684 |
| 43.412 | 3.682 |

TABLE 1-continued

| θi | sagY |
|---|---|
| 43.611 | 3.679 |
| 43.809 | 3.676 |
| 44.008 | 3.673 |
| 44.207 | 3.669 |
| 44.406 | 3.666 |
| 44.606 | 3.662 |
| 44.805 | 3.658 |
| 45.005 | 3.654 |
| 45.205 | 3.650 |
| 45.406 | 3.646 |
| 45.606 | 3.642 |
| 45.807 | 3.637 |
| 46.008 | 3.632 |
| 46.209 | 3.628 |
| 46.410 | 3.623 |
| 46.611 | 3.618 |
| 46.813 | 3.612 |
| 47.014 | 3.607 |
| 47.216 | 3.602 |
| 47.418 | 3.596 |
| 47.6193 | 3.590 |
| 47.8210 | 3.584 |
| 48.0228 | 3.578 |
| 48.2246 | 3.572 |
| 48.4264 | 3.566 |
| 48.6282 | 3.560 |
| 48.8301 | 3.554 |
| 49.0319 | 3.547 |
| 49.2337 | 3.540 |
| 49.4355 | 3.534 |
| 49.6372 | 3.527 |
| 49.8390 | 3.520 |
| 50.0408 | 3.513 |
| 50.2425 | 3.506 |
| 50.4443 | 3.498 |
| 50.6460 | 3.491 |
| 50.8478 | 3.484 |
| 51.0496 | 3.476 |
| 51.2515 | 3.468 |
| 51.4534 | 3.460 |
| 51.6554 | 3.452 |
| 51.8575 | 3.444 |
| 52.0596 | 3.436 |
| 52.2620 | 3.428 |
| 52.4644 | 3.419 |
| 52.6671 | 3.411 |
| 52.8700 | 3.402 |
| 53.0731 | 3.393 |
| 53.2765 | 3.384 |
| 53.4802 | 3.375 |
| 53.6842 | 3.366 |
| 53.8886 | 3.357 |
| 54.0933 | 3.347 |
| 54.2985 | 3.337 |
| 54.5042 | 3.327 |
| 54.7104 | 3.317 |
| 54.9171 | 3.307 |
| 55.1244 | 3.297 |
| 55.3323 | 3.286 |
| 55.5409 | 3.275 |
| 55.7501 | 3.264 |
| 55.9601 | 3.253 |
| 56.1708 | 3.242 |
| 56.3823 | 3.230 |
| 56.5947 | 3.219 |
| 56.8079 | 3.207 |
| 57.0220 | 3.195 |
| 57.2370 | 3.182 |
| 57.4530 | 3.170 |
| 57.6700 | 3.157 |
| 57.8879 | 3.144 |
| 58.1070 | 3.131 |
| 58.3271 | 3.117 |
| 58.5483 | 3.103 |
| 58.7706 | 3.090 |
| 58.9941 | 3.075 |
| 59.2187 | 3.061 |
| 59.4445 | 3.046 |
| 59.6716 | 3.031 |
| 59.8998 | 3.016 |
| 60.1294 | 3.001 |
| 60.360 | 2.985 |
| 60.592 | 2.969 |
| 60.826 | 2.953 |
| 61.061 | 2.936 |
| 61.297 | 2.920 |
| 61.534 | 2.903 |
| 61.773 | 2.885 |
| 62.014 | 2.868 |
| 62.256 | 2.850 |
| 62.500 | 2.832 |
| 62.745 | 2.813 |
| 62.993 | 2.794 |
| 63.242 | 2.775 |
| 63.493 | 2.756 |
| 63.746 | 2.736 |
| 64.002 | 2.716 |
| 64.260 | 2.695 |
| 64.520 | 2.674 |
| 64.784 | 2.653 |
| 65.050 | 2.631 |
| 65.320 | 2.608 |
| 65.594 | 2.585 |
| 65.871 | 2.562 |
| 66.153 | 2.537 |
| 66.279 | 2.527 |
| 66.659 | 2.493 |
| 66.872 | 2.475 |
| 67.134 | 2.451 |
| 67.401 | 2.427 |
| 67.673 | 2.402 |
| 67.951 | 2.377 |
| 68.236 | 2.350 |
| 68.529 | 2.323 |
| 68.829 | 2.295 |
| 69.138 | 2.265 |
| 69.456 | 2.234 |
| 69.785 | 2.202 |
| 70.125 | 2.169 |
| 70.477 | 2.134 |
| 70.843 | 2.097 |
| 71.223 | 2.059 |
| 71.619 | 2.018 |
| 72.033 | 1.976 |
| 72.465 | 1.931 |
| 72.917 | 1.884 |
| 73.392 | 1.834 |
| 73.891 | 1.781 |
| 74.415 | 1.725 |
| 74.968 | 1.666 |
| 75.552 | 1.604 |
| 76.169 | 1.537 |
| 76.821 | 1.466 |
| 77.512 | 1.391 |
| 78.245 | 1.311 |
| 79.023 | 1.225 |
| 79.850 | 1.134 |

Figure 8:
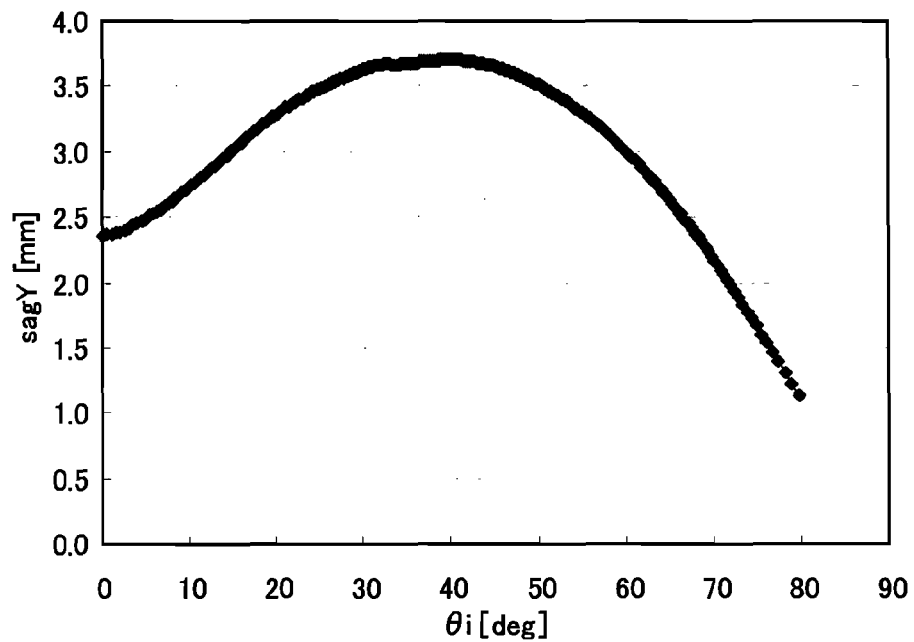
FIG. 8 is a graph showing a relationship between $\theta i$ and sagY, which represent the shape of the light exit surface in Example 1 of the lighting device according to the second embodiment of the present invention (i.e., a graph obtained by plotting the values in Table 1).
Figure 11:
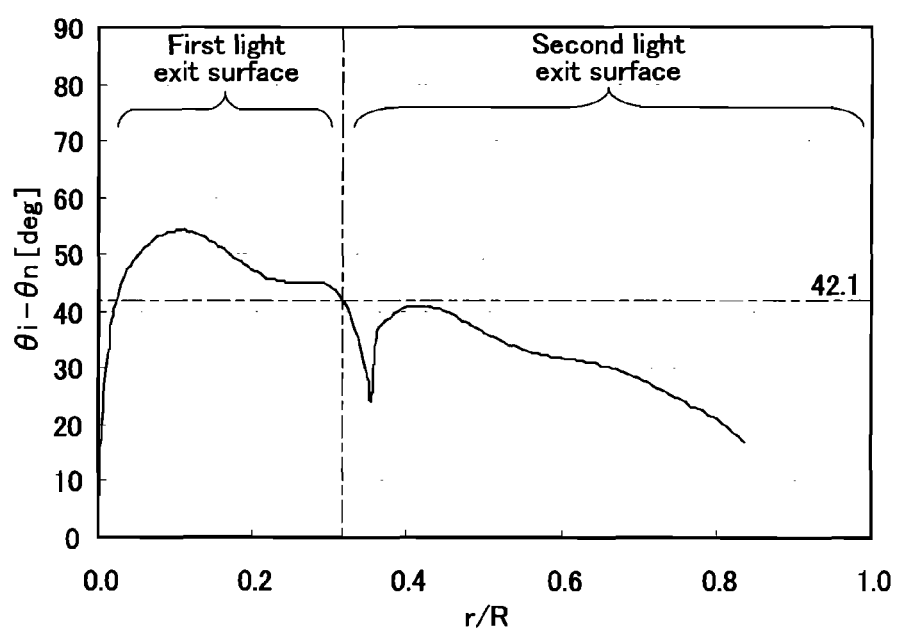
FIG. 11 is a graph showing a relationship between r/R and $\theta i$-$\theta n$ in Example 1 of the lighting device according to the second embodiment of the present invention.

FIG. 8 is a graph obtained by plotting the values of θi and sagY in Table 1. FIG. 11 is a graph showing a relationship between r/R and θi-θn. Here, r/R is a value obtained by normalizing, with respect to the outermost radius of the lens, the distance in the direction parallel to the light entrance surface 11 from the optical axis A to the arbitrary point on the light exit surface 12, where r is the distance in the direction parallel to the light entrance surface from the optical axis to the arbitrary point on the light exit surface, and R is the outermost radius of the lens (see FIG. 7).

θi-θn is an angle of a light ray emitted at an angle of θi, with respect to a normal line at a point on the light exit surface 12 reached by the light ray, that is, an incident angle of the light ray on the light exit surface 12. As a condition of the total reflection region 124 of the first light exit surface 121, since the refractive index of the transparent material constituting the lens in Example 1 is 1.492, θi-θn is 42.1 degrees or more. Accordingly, FIG. 11 shows that in Example 1, the transmissive region 123 of the first light exit surface 121 is a narrow region in the vicinity of the optical axis and the total reflection region 124 is a wide region away from the optical axis. FIG. 11 also shows that in Example 1, the entire second light exit surface 122 totally reflects the light emitted from the starting point Q.

In Example 1, $R_{in}$, $R_{out}$, $R_{LS}$, and R shown in FIG. 7 are 4.5, 5.5, 1.41, and 6.95, respectively. Accordingly, $R_{in}/R$ is 0.65 and $R_{out}/R$ is 0.79, and these values satisfy the above inequalities (1) and (2). Furthermore, in Example 1, the reflectance of the reflective layer 10 is 67.7%.

Figure 14:
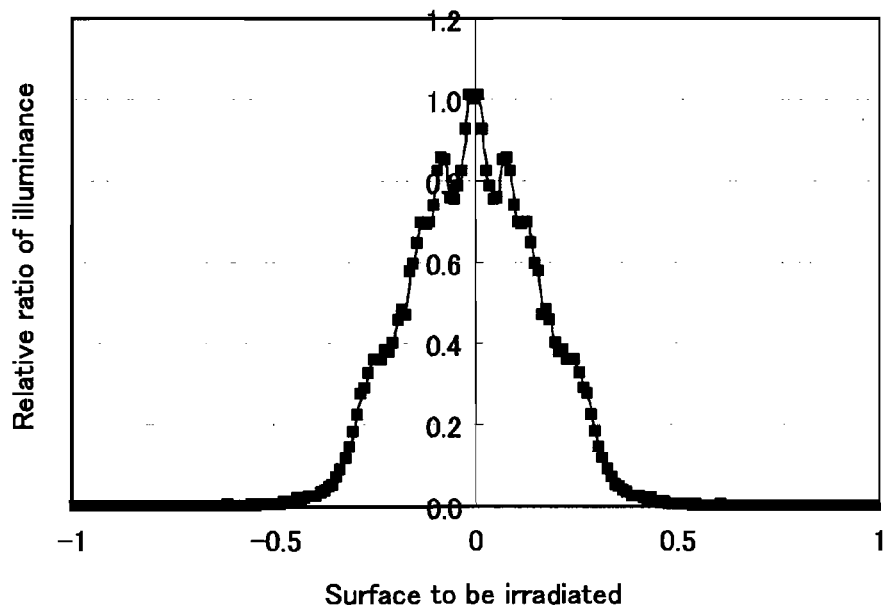
FIG. 14 shows an illuminance distribution in Example 1 of the lighting device according to the second embodiment of the present invention.
Figure 17:
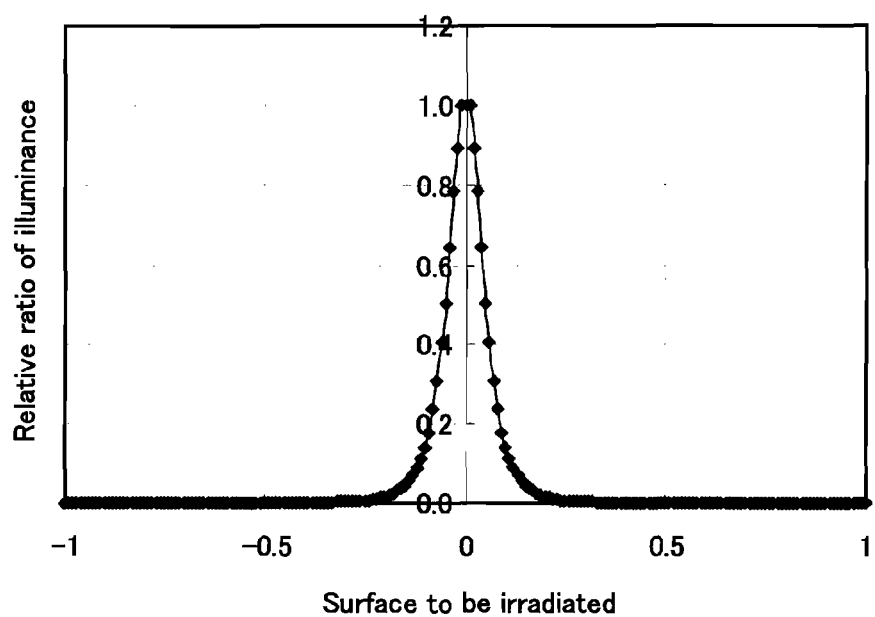
FIG. 17 shows an illuminance distribution obtained when only light emitting diodes are used to confirm the effects of Examples 1 to 3.

FIG. 14 shows the illuminance distribution on the surface to be irradiated obtained by calculation assuming that the lighting device of Example 1 (i.e., the illuminating lens in FIG. 8 and the light emitting diode) is used and the surface to be irradiated is placed at a distance of 16.4 mm from the light emitting diode. FIG. 17 shows the illuminance distribution on the surface to be irradiated obtained by calculation assuming that only the same light emitting diode as in FIG. 14 is used and the surface to be irradiated is placed at a distance of 16.4 mm from the light emitting diode. Each of FIG. 14 and FIG. 17 shows a curve indicating the distribution of illuminances on the surface to be irradiated when the illuminances are normalized with respect to the illuminance at the center of the optical axis being 1. A comparison between FIG. 14 and FIG. 17 shows that the illuminating lens is effective in increasing the illuminated area of the surface to be irradiated.

Example 2

Table 2 below shows specific numerical values in Example 2.

TABLE 2

| θi | sagY |
| --- | --- |
| 0.000 | 1.842 |
| 0.668 | 1.844 |
| 1.332 | 1.849 |
| 1.989 | 1.857 |
| 2.635 | 1.868 |
| 3.269 | 1.882 |
| 3.886 | 1.899 |
| 4.487 | 1.918 |
| 5.071 | 1.938 |
| 5.636 | 1.961 |
| 6.182 | 1.985 |
| 6.711 | 2.010 |
| 7.221 | 2.036 |
| 7.715 | 2.063 |
| 8.192 | 2.091 |
| 8.654 | 2.119 |
| 9.100 | 2.148 |
| 9.533 | 2.176 |
| 9.953 | 2.205 |
| 10.361 | 2.234 |
| 10.757 | 2.263 |
| 11.143 | 2.292 |
| 11.519 | 2.321 |
| 11.886 | 2.349 |
| 12.245 | 2.378 |
| 12.596 | 2.405 |
| 12.940 | 2.433 |
| 13.278 | 2.460 |
| 13.609 | 2.487 |
| 13.935 | 2.513 |
| 14.256 | 2.539 |
| 14.572 | 2.564 |
| 14.884 | 2.589 |

TABLE 2-continued

| θi | sagY |
| --- | --- |
| 15.193 | 2.613 |
| 15.497 | 2.636 |
| 15.799 | 2.659 |
| 16.098 | 2.682 |
| 16.394 | 2.704 |
| 16.688 | 2.725 |
| 16.980 | 2.746 |
| 17.270 | 2.766 |
| 17.558 | 2.786 |
| 17.845 | 2.805 |
| 18.130 | 2.823 |
| 18.415 | 2.841 |
| 18.698 | 2.859 |
| 18.981 | 2.875 |
| 19.262 | 2.892 |
| 19.543 | 2.907 |
| 19.824 | 2.922 |
| 20.104 | 2.937 |
| 20.384 | 2.951 |
| 20.663 | 2.964 |
| 20.942 | 2.977 |
| 21.221 | 2.990 |
| 21.500 | 3.002 |
| 21.778 | 3.014 |
| 22.056 | 3.025 |
| 22.334 | 3.035 |
| 22.613 | 3.046 |
| 22.890 | 3.055 |
| 23.168 | 3.065 |
| 23.446 | 3.074 |
| 23.723 | 3.082 |
| 24.001 | 3.090 |
| 24.278 | 3.098 |
| 24.554 | 3.106 |
| 24.831 | 3.113 |
| 25.107 | 3.120 |
| 25.383 | 3.127 |
| 25.658 | 3.133 |
| 25.933 | 3.139 |
| 26.208 | 3.145 |
| 26.482 | 3.150 |
| 26.755 | 3.156 |
| 27.027 | 3.161 |
| 27.299 | 3.166 |
| 27.570 | 3.171 |
| 27.840 | 3.175 |
| 28.109 | 3.180 |
| 28.377 | 3.184 |
| 28.644 | 3.188 |
| 28.910 | 3.192 |
| 29.175 | 3.196 |
| 29.438 | 3.200 |
| 29.700 | 3.204 |
| 29.960 | 3.208 |
| 30.220 | 3.211 |
| 30.477 | 3.215 |
| 30.733 | 3.218 |
| 30.988 | 3.222 |
| 31.241 | 3.225 |
| 31.492 | 3.229 |
| 31.741 | 3.232 |
| 31.989 | 3.236 |
| 32.235 | 3.239 |
| 32.479 | 3.242 |
| 32.721 | 3.246 |
| 32.961 | 3.249 |
| 33.200 | 3.253 |
| 33.437 | 3.256 |
| 33.672 | 3.260 |
| 33.905 | 3.263 |
| 34.137 | 3.266 |
| 34.366 | 3.270 |
| 34.594 | 3.273 |
| 34.821 | 3.277 |
| 35.046 | 3.280 |
| 35.269 | 3.283 |
| 35.491 | 3.287 |
| 35.712 | 3.290 |

TABLE 2-continued

| θi | sagY |
|---|---|
| 35.931 | 3.293 |
| 36.150 | 3.296 |
| 36.367 | 3.299 |
| 36.583 | 3.302 |
| 36.799 | 3.305 |
| 37.014 | 3.308 |
| 37.229 | 3.311 |
| 37.443 | 3.313 |
| 37.657 | 3.315 |
| 37.872 | 3.318 |
| 38.086 | 3.319 |
| 38.301 | 3.321 |
| 38.517 | 3.323 |
| 38.734 | 3.324 |
| 38.962 | 3.323 |
| 39.213 | 3.320 |
| 39.461 | 3.317 |
| 39.708 | 3.314 |
| 39.952 | 3.311 |
| 40.194 | 3.308 |
| 40.434 | 3.305 |
| 40.672 | 3.303 |
| 40.909 | 3.300 |
| 41.144 | 3.297 |
| 41.377 | 3.295 |
| 41.609 | 3.292 |
| 41.839 | 3.290 |
| 42.068 | 3.287 |
| 42.295 | 3.285 |
| 42.521 | 3.282 |
| 42.747 | 3.280 |
| 42.971 | 3.277 |
| 43.194 | 3.275 |
| 43.416 | 3.272 |
| 43.637 | 3.269 |
| 43.858 | 3.267 |
| 44.078 | 3.264 |
| 44.297 | 3.261 |
| 44.516 | 3.258 |
| 44.735 | 3.255 |
| 44.953 | 3.252 |
| 45.171 | 3.249 |
| 45.389 | 3.245 |
| 45.606 | 3.242 |
| 45.824 | 3.238 |
| 46.041 | 3.234 |
| 46.259 | 3.230 |
| 46.476 | 3.226 |
| 46.694 | 3.222 |
| 46.912 | 3.218 |
| 47.131 | 3.213 |
| 47.350 | 3.208 |
| 47.569 | 3.204 |
| 47.789 | 3.198 |
| 48.009 | 3.193 |
| 48.230 | 3.188 |
| 48.451 | 3.182 |
| 48.673 | 3.176 |
| 48.896 | 3.170 |
| 49.119 | 3.164 |
| 49.343 | 3.157 |
| 49.568 | 3.151 |
| 49.794 | 3.144 |
| 50.020 | 3.137 |
| 50.248 | 3.129 |
| 50.476 | 3.122 |
| 50.705 | 3.114 |
| 50.935 | 3.106 |
| 51.166 | 3.098 |
| 51.399 | 3.090 |
| 51.632 | 3.081 |
| 51.865 | 3.072 |
| 52.1004 | 3.063 |
| 52.3363 | 3.054 |
| 52.5733 | 3.044 |
| 52.8112 | 3.034 |
| 53.0501 | 3.024 |
| 53.2900 | 3.014 |

TABLE 2-continued

| θi | sagY |
|---|---|
| 53.5309 | 3.003 |
| 53.7728 | 2.993 |
| 54.0156 | 2.982 |
| 54.2595 | 2.971 |
| 54.5043 | 2.959 |
| 54.7501 | 2.948 |
| 54.9969 | 2.936 |
| 55.2447 | 2.924 |
| 55.4934 | 2.912 |
| 55.7430 | 2.899 |
| 55.9937 | 2.887 |
| 56.2453 | 2.874 |
| 56.4978 | 2.861 |
| 56.7513 | 2.847 |
| 57.0057 | 2.834 |
| 57.2612 | 2.820 |
| 57.5176 | 2.806 |
| 57.7750 | 2.792 |
| 58.0334 | 2.777 |
| 58.2928 | 2.763 |
| 58.5533 | 2.748 |
| 58.8149 | 2.733 |
| 59.0776 | 2.717 |
| 59.3416 | 2.702 |
| 59.6067 | 2.686 |
| 59.8731 | 2.670 |
| 60.1409 | 2.654 |
| 60.4101 | 2.637 |
| 60.6809 | 2.620 |
| 60.9533 | 2.603 |
| 61.2274 | 2.586 |
| 61.5035 | 2.568 |
| 61.7815 | 2.550 |
| 62.0618 | 2.531 |
| 62.3444 | 2.512 |
| 62.6296 | 2.493 |
| 62.9175 | 2.474 |
| 63.2085 | 2.454 |
| 63.5027 | 2.433 |
| 63.8006 | 2.412 |
| 64.1023 | 2.390 |
| 64.4083 | 2.368 |
| 64.7190 | 2.346 |
| 65.0347 | 2.322 |
| 65.3559 | 2.298 |
| 65.6831 | 2.273 |
| 66.0169 | 2.248 |
| 66.3578 | 2.221 |
| 66.7066 | 2.194 |
| 67.0639 | 2.165 |
| 67.4304 | 2.136 |
| 67.8071 | 2.105 |
| 68.1948 | 2.073 |
| 68.5945 | 2.040 |
| 69.0072 | 2.005 |
| 69.434 | 1.968 |
| 69.877 | 1.930 |
| 70.336 | 1.890 |
| 70.813 | 1.848 |
| 71.311 | 1.804 |
| 71.830 | 1.757 |
| 72.372 | 1.708 |
| 72.940 | 1.656 |
| 73.536 | 1.601 |
| 74.161 | 1.543 |
| 74.819 | 1.482 |
| 75.512 | 1.417 |
| 76.243 | 1.348 |
| 77.015 | 1.274 |
| 77.832 | 1.196 |
| 78.696 | 1.113 |
| 79.613 | 1.025 |

Figure 9:
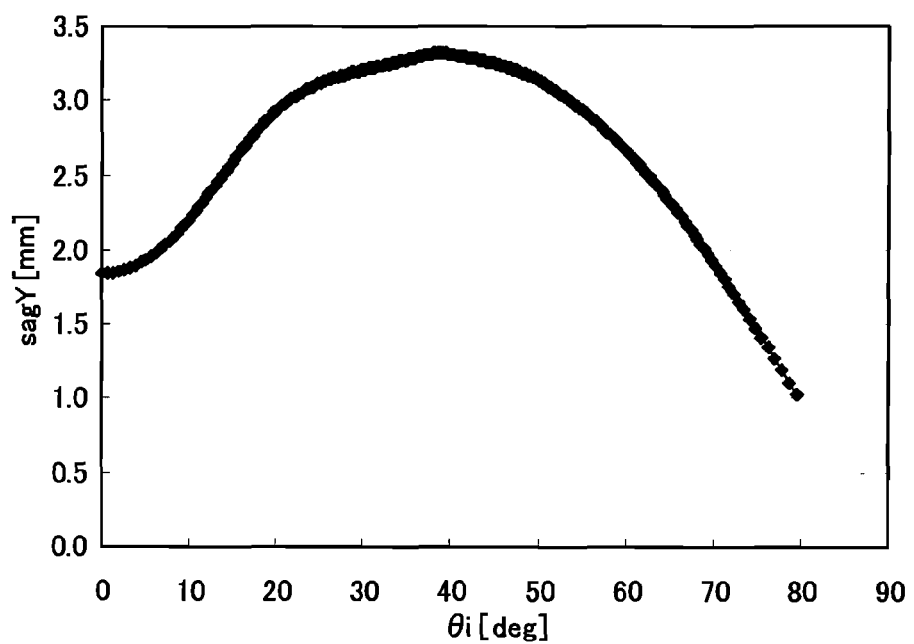
FIG. 9 is a graph showing a relationship between $\theta i$ and sagY, which represent the shape of the light exit surface in Example 2 of the lighting device according to the second embodiment of the present invention (i.e., a graph obtained by plotting the values in Table 2).
Figure 12:
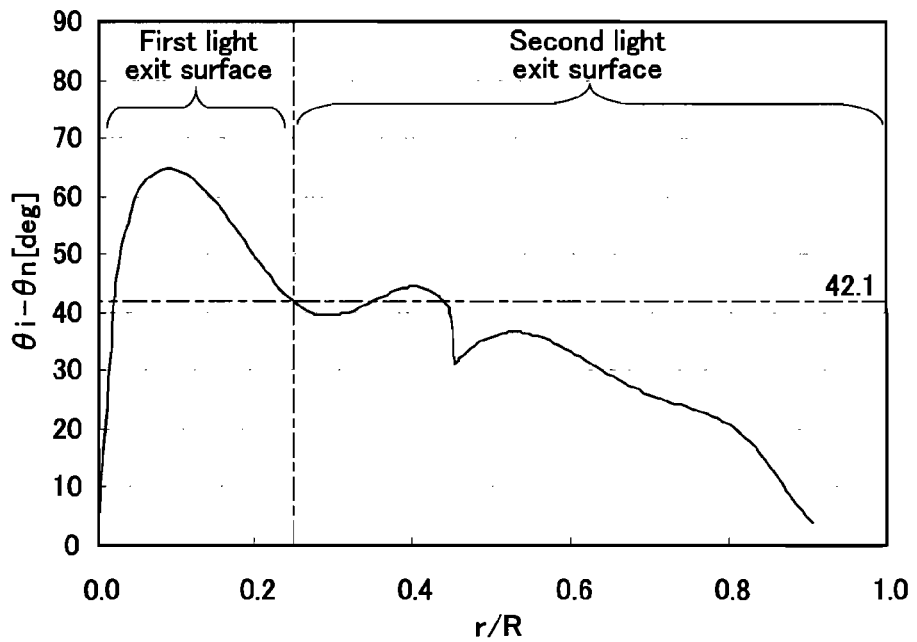
FIG. 12 is a graph showing a relationship between r/R and $\theta i$-$\theta n$ in Example 2 of the lighting device according to the second embodiment of the present invention.

FIG. 9 is a graph obtained by plotting the values of θi and sagY in Table 2. FIG. 12 is a graph showing a relationship between r/R and θi-θn. r/R and θi-θn in FIG. 12 are the same as those in FIG. 11.

In Example 2, the lens is made of a material having a refractive index of 1.492, as in the case of Example 1 described above. Accordingly, as a condition of the total reflection region 124 of the first light exit surface 121, $\theta i-\theta n$ is 42.1 degrees or more, as in the case of Example 1. Accordingly, FIG. 12 shows that in Example 2, the transmissive region 123 is as narrow as that of Example 1, and the total reflection region 124 is narrower than that of Example 1. FIG. 12 also shows that in Example 2, the second light exit surface 122 totally reflects a part of the light emitted from the starting point Q and transmits the remaining part of the light.

In Example 2, $R_{in}$, $R_{out}$, $R_{LS}$, and R shown in FIG. 7 are 2.50, 5.90, 1.41, and 6.00, respectively. Accordingly, $R_{in}/R$ is 0.42 and $R_{out}/R$ is 0.98, and these values satisfy the above inequalities (1) and (2). Furthermore, in Example 2, the reflectance of the reflective layer 10 is 97.7%.

Figure 15:
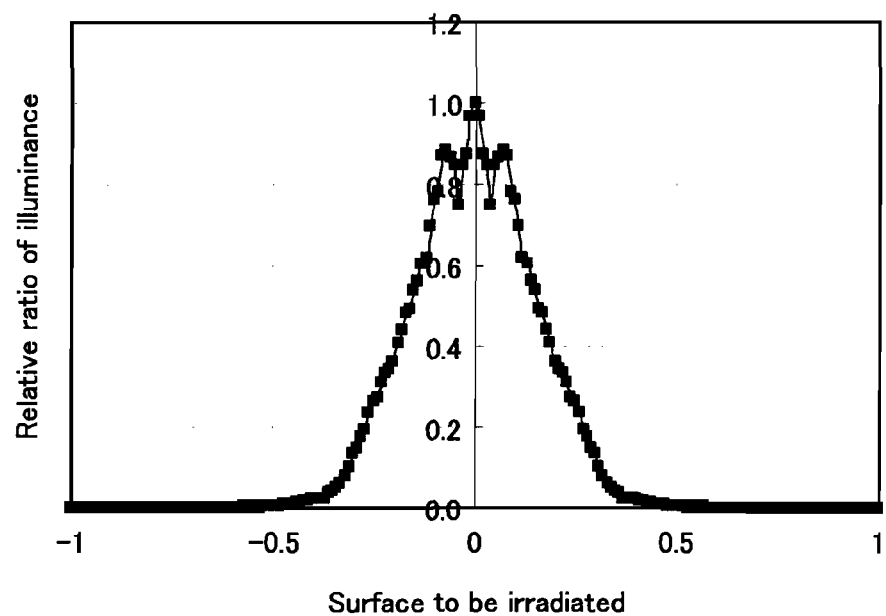
FIG. 15 shows an illuminance distribution in Example 2 of the lighting device according to the second embodiment of the present invention.

FIG. 15 shows the illuminance distribution on the surface to be irradiated obtained by calculation assuming that the lighting device of Example 2 (i.e., the illuminating lens in FIG. 9 and the light emitting diode) is used and the surface to be irradiated is placed at a distance of 16.4 mm from the light emitting diode. FIG. 15 shows a curve indicating the distribution of illuminances on the surface to be irradiated when the illuminances are normalized with respect to the illuminance at the center of the optical axis being 1, as in the case of FIG. 14. A comparison between FIG. 15 and FIG. 17 shows that the illuminating lens is effective in increasing the illuminated area of the surface to be irradiated.

Example 3

Table 3 below shows specific numerical values in Example 3.

TABLE 3

| $\theta i$ | sagY |
|---|---|
| 0.000 | 2.411 |
| 0.510 | 2.413 |
| 1.018 | 2.420 |
| 1.520 | 2.431 |
| 2.016 | 2.443 |
| 2.504 | 2.458 |
| 2.985 | 2.473 |
| 3.459 | 2.490 |
| 3.925 | 2.507 |
| 4.384 | 2.524 |
| 4.835 | 2.542 |
| 5.279 | 2.559 |
| 5.716 | 2.578 |
| 6.146 | 2.596 |
| 6.569 | 2.614 |
| 6.985 | 2.632 |
| 7.394 | 2.651 |
| 7.797 | 2.669 |
| 8.193 | 2.688 |
| 8.584 | 2.706 |
| 8.968 | 2.725 |
| 9.347 | 2.743 |
| 9.720 | 2.761 |
| 10.088 | 2.779 |
| 10.451 | 2.798 |
| 10.808 | 2.815 |
| 11.161 | 2.833 |
| 11.509 | 2.851 |
| 11.853 | 2.868 |
| 12.192 | 2.886 |
| 12.527 | 2.903 |
| 12.859 | 2.920 |
| 13.186 | 2.936 |
| 13.510 | 2.953 |
| 13.831 | 2.969 |

TABLE 3-continued

| $\theta i$ | sagY |
|---|---|
| 14.149 | 2.985 |
| 14.463 | 3.001 |
| 14.775 | 3.016 |
| 15.084 | 3.031 |
| 15.390 | 3.046 |
| 15.693 | 3.061 |
| 15.995 | 3.075 |
| 16.294 | 3.089 |
| 16.591 | 3.103 |
| 16.885 | 3.117 |
| 17.178 | 3.130 |
| 17.469 | 3.143 |
| 17.758 | 3.155 |
| 18.045 | 3.168 |
| 18.331 | 3.180 |
| 18.615 | 3.192 |
| 18.897 | 3.203 |
| 19.177 | 3.215 |
| 19.457 | 3.226 |
| 19.734 | 3.236 |
| 20.010 | 3.247 |
| 20.284 | 3.258 |
| 20.557 | 3.268 |
| 20.829 | 3.278 |
| 21.099 | 3.288 |
| 21.367 | 3.297 |
| 21.633 | 3.307 |
| 21.898 | 3.316 |
| 22.162 | 3.325 |
| 22.424 | 3.335 |
| 22.684 | 3.343 |
| 22.942 | 3.352 |
| 23.199 | 3.361 |
| 23.454 | 3.370 |
| 23.708 | 3.378 |
| 23.959 | 3.387 |
| 24.209 | 3.395 |
| 24.457 | 3.403 |
| 24.704 | 3.412 |
| 24.949 | 3.420 |
| 25.192 | 3.428 |
| 25.434 | 3.436 |
| 25.674 | 3.444 |
| 25.913 | 3.452 |
| 26.150 | 3.459 |
| 26.387 | 3.467 |
| 26.622 | 3.474 |
| 26.857 | 3.482 |
| 27.090 | 3.489 |
| 27.324 | 3.496 |
| 27.557 | 3.502 |
| 27.790 | 3.508 |
| 28.024 | 3.514 |
| 28.258 | 3.520 |
| 28.494 | 3.525 |
| 28.731 | 3.530 |
| 28.970 | 3.534 |
| 29.212 | 3.537 |
| 29.457 | 3.540 |
| 29.705 | 3.542 |
| 29.959 | 3.544 |
| 30.198 | 3.547 |
| 30.453 | 3.547 |
| 30.704 | 3.548 |
| 30.953 | 3.549 |
| 31.199 | 3.550 |
| 31.443 | 3.552 |
| 31.684 | 3.553 |
| 31.923 | 3.555 |
| 32.160 | 3.556 |
| 32.394 | 3.558 |
| 32.627 | 3.560 |
| 32.857 | 3.562 |
| 33.086 | 3.564 |
| 33.313 | 3.566 |
| 33.538 | 3.568 |
| 33.762 | 3.570 |
| 33.985 | 3.572 |

TABLE 3-continued

| θ i | sagY |
|---|---|
| 34.205 | 3.574 |
| 34.425 | 3.576 |
| 34.644 | 3.578 |
| 34.861 | 3.580 |
| 35.078 | 3.582 |
| 35.293 | 3.584 |
| 35.508 | 3.586 |
| 35.721 | 3.588 |
| 35.935 | 3.589 |
| 36.147 | 3.591 |
| 36.359 | 3.592 |
| 36.570 | 3.594 |
| 36.781 | 3.595 |
| 36.992 | 3.596 |
| 37.202 | 3.597 |
| 37.412 | 3.598 |
| 37.622 | 3.599 |
| 37.831 | 3.599 |
| 38.040 | 3.600 |
| 38.250 | 3.600 |
| 38.459 | 3.600 |
| 38.668 | 3.600 |
| 38.877 | 3.600 |
| 39.085 | 3.600 |
| 39.294 | 3.599 |
| 39.503 | 3.599 |
| 39.712 | 3.598 |
| 39.921 | 3.597 |
| 40.130 | 3.596 |
| 40.339 | 3.595 |
| 40.549 | 3.594 |
| 40.758 | 3.592 |
| 40.967 | 3.590 |
| 41.176 | 3.589 |
| 41.386 | 3.587 |
| 41.595 | 3.585 |
| 41.804 | 3.582 |
| 42.014 | 3.580 |
| 42.223 | 3.577 |
| 42.433 | 3.575 |
| 42.642 | 3.572 |
| 42.852 | 3.569 |
| 43.061 | 3.566 |
| 43.270 | 3.563 |
| 43.480 | 3.560 |
| 43.689 | 3.556 |
| 43.898 | 3.553 |
| 44.107 | 3.549 |
| 44.316 | 3.545 |
| 44.525 | 3.541 |
| 44.734 | 3.537 |
| 44.943 | 3.533 |
| 45.152 | 3.529 |
| 45.361 | 3.524 |
| 45.569 | 3.520 |
| 45.778 | 3.515 |
| 45.986 | 3.511 |
| 46.194 | 3.506 |
| 46.403 | 3.501 |
| 46.611 | 3.496 |
| 46.819 | 3.491 |
| 47.027 | 3.485 |
| 47.235 | 3.480 |
| 47.443 | 3.474 |
| 47.652 | 3.469 |
| 47.860 | 3.463 |
| 48.068 | 3.457 |
| 48.277 | 3.451 |
| 48.486 | 3.445 |
| 48.695 | 3.438 |
| 48.9038 | 3.432 |
| 49.1133 | 3.425 |
| 49.3230 | 3.418 |
| 49.5332 | 3.411 |
| 49.7437 | 3.404 |
| 49.9546 | 3.397 |
| 50.1661 | 3.390 |
| 50.3781 | 3.382 |

TABLE 3-continued

| θ i | sagY |
|---|---|
| 50.5906 | 3.374 |
| 50.8038 | 3.366 |
| 51.0177 | 3.358 |
| 51.2322 | 3.350 |
| 51.4476 | 3.341 |
| 51.6637 | 3.332 |
| 51.8807 | 3.323 |
| 52.0986 | 3.314 |
| 52.3174 | 3.305 |
| 52.5372 | 3.295 |
| 52.7580 | 3.285 |
| 52.9799 | 3.275 |
| 53.2029 | 3.265 |
| 53.4269 | 3.254 |
| 53.6521 | 3.243 |
| 53.8785 | 3.232 |
| 54.1061 | 3.221 |
| 54.3349 | 3.209 |
| 54.5649 | 3.198 |
| 54.7961 | 3.185 |
| 55.0286 | 3.173 |
| 55.2624 | 3.161 |
| 55.4974 | 3.148 |
| 55.7336 | 3.135 |
| 55.9711 | 3.121 |
| 56.2099 | 3.108 |
| 56.4498 | 3.094 |
| 56.6910 | 3.080 |
| 56.9333 | 3.066 |
| 57.1768 | 3.051 |
| 57.4214 | 3.036 |
| 57.6672 | 3.021 |
| 57.9140 | 3.006 |
| 58.1618 | 2.990 |
| 58.4107 | 2.975 |
| 58.6605 | 2.959 |
| 58.9113 | 2.943 |
| 59.1630 | 2.926 |
| 59.4156 | 2.910 |
| 59.6691 | 2.893 |
| 59.9234 | 2.876 |
| 60.1786 | 2.859 |
| 60.4346 | 2.842 |
| 60.6914 | 2.824 |
| 60.9492 | 2.807 |
| 61.2078 | 2.789 |
| 61.4673 | 2.770 |
| 61.7278 | 2.752 |
| 61.9894 | 2.733 |
| 62.2523 | 2.715 |
| 62.5164 | 2.695 |
| 62.7819 | 2.676 |
| 63.0492 | 2.656 |
| 63.318 | 2.636 |
| 63.590 | 2.616 |
| 63.863 | 2.595 |
| 64.140 | 2.574 |
| 64.419 | 2.552 |
| 64.702 | 2.530 |
| 64.990 | 2.508 |
| 65.282 | 2.484 |
| 65.579 | 2.460 |
| 65.883 | 2.435 |
| 66.193 | 2.409 |
| 66.511 | 2.383 |
| 66.838 | 2.355 |
| 67.175 | 2.326 |
| 67.522 | 2.295 |
| 67.882 | 2.263 |
| 68.256 | 2.229 |
| 68.646 | 2.194 |
| 69.052 | 2.156 |
| 69.478 | 2.117 |
| 69.926 | 2.074 |
| 70.397 | 2.029 |
| 70.894 | 1.981 |
| 71.420 | 1.930 |
| 71.979 | 1.875 |

TABLE 3-continued

| θi | sagY |
|---|---|
| 72.573 | 1.815 |
| 73.206 | 1.752 |
| 73.881 | 1.684 |
| 74.605 | 1.610 |
| 75.380 | 1.531 |
| 76.212 | 1.446 |
| 77.106 | 1.353 |
| 78.069 | 1.254 |
| 79.105 | 1.146 |
| 80.223 | 1.030 |

Figure 10:
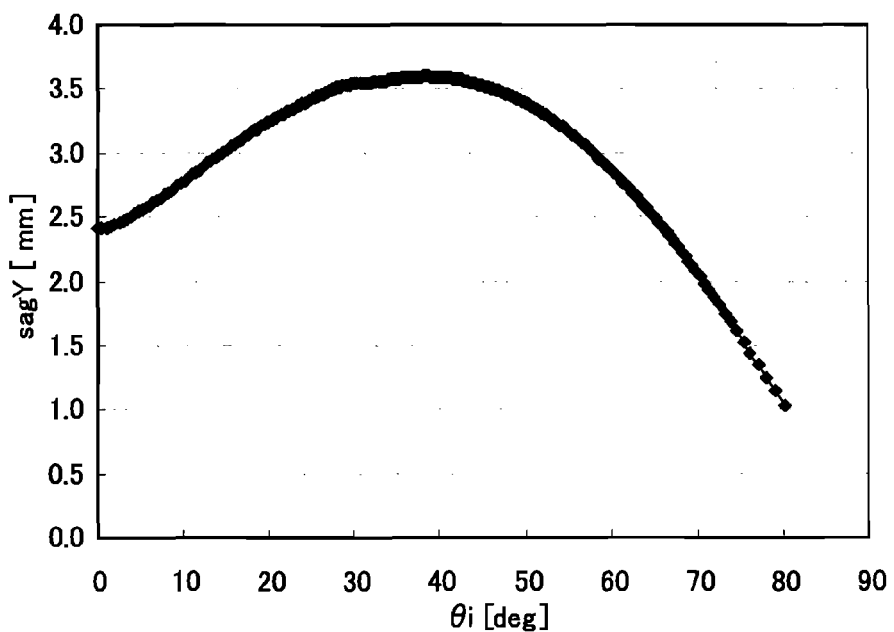
FIG. 10 is a graph showing a relationship between $\theta i$ and sagY, which represent the shape of the light exit surface in Example 3 of the lighting device according to the second embodiment of the present invention (i.e., a graph obtained by plotting the values in Table 3).
Figure 13:
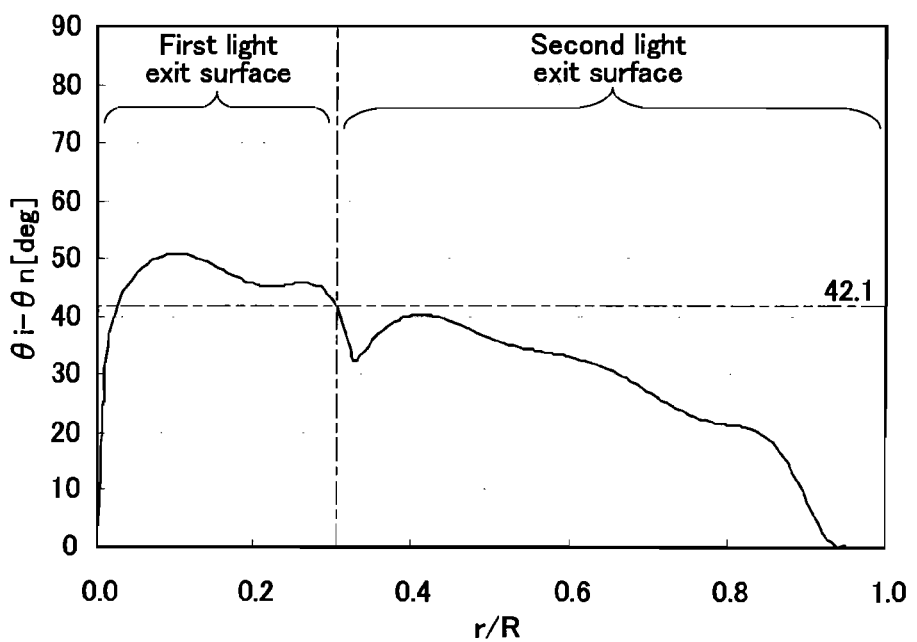
FIG. 13 is a graph showing a relationship between r/R and $\theta i$-$\theta n$ in Example 3 of the lighting device according to the second embodiment of the present invention.

FIG. 10 is a graph obtained by plotting the values of θi and sagY in Table 3. FIG. 13 is a graph showing a relationship between r/R and θi-θn. r/R and θi-θn in FIG. 13 are the same as those in FIG. 11.

In Example 3, the lens is made of a material having a refractive index of 1.492, as in the case of Example 1 described above. Accordingly, as a condition of the total reflection region 124 of the first light exit surface 121, θi-θn is 42.1 degrees or more, as in the case of Example 1. Accordingly, FIG. 13 shows that in Example 3, the transmissive region 123 is as narrow as that of Example 1, and the total reflection region 124 is as wide as that of Example 1. FIG. 13 also shows that in Example 3, the entire second light exit surface 122 totally reflects the light emitted from the starting point Q.

In Example 3, $R_{in}$, $R_{out}$, $R_{LS}$, and R shown in FIG. 7 are 1.60, 6.25, 1.41, and 6.25, respectively. Accordingly, $R_{in}/R$ is 0.26 and $R_{out}/R$ is 1.00, and these values satisfy the above inequalities (1) and (2). Furthermore, in Example 3, the reflectance of the reflective layer 10 shown in FIG. 7 is 98.7%.

Figure 16:
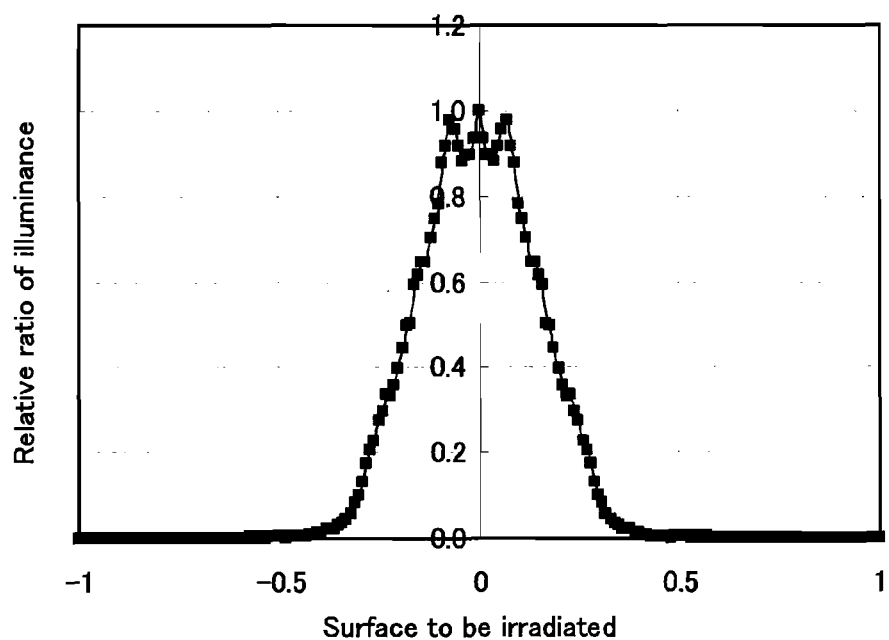
FIG. 16 shows an illuminance distribution in Example 3 of the lighting device according to the second embodiment of the present invention.

FIG. 16 shows the illuminance distribution on the surface to be irradiated obtained by calculation assuming that the lighting device of Example 3 (i.e., the illuminating lens in FIG. 10 and the light emitting diode) is used and the surface to be irradiated is placed at a distance of 16.4 mm from the light emitting diode. FIG. 16 shows a curve indicating the distribution of illuminances on the surface to be irradiated when the illuminances are normalized with respect to the illuminance at the center of the optical axis being 1, as in the case of FIG. 14. A comparison between FIG. 16 and FIG. 17 shows that the illuminating lens is effective in increasing the illuminated area of the surface to be irradiated.

Third Embodiment

Figure 18:
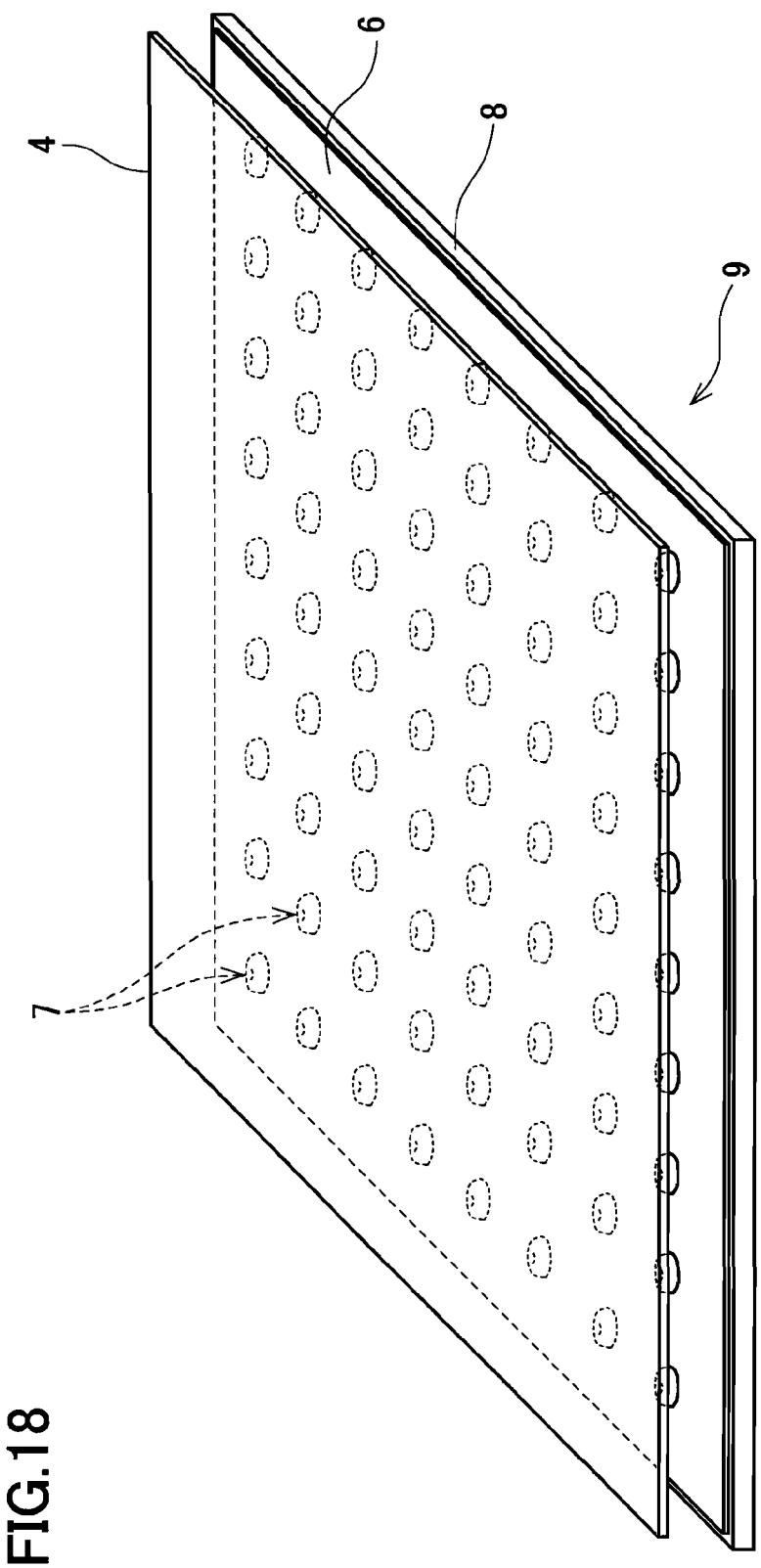
FIG. 18 is a schematic diagram of a surface light source according to a third embodiment of the present invention.

FIG. 18 is a schematic diagram of a surface light source 9 according to a third embodiment of the present invention. This surface light source 9 includes a plurality of lighting devices 7 of the second embodiment arranged in a plane, and a diffusing plate 4 disposed to cover the plurality of lighting devices 7. The lighting devices 7 may be arranged in a matrix as shown in FIG. 18. They may be arranged in a staggered manner.

Figure 19:
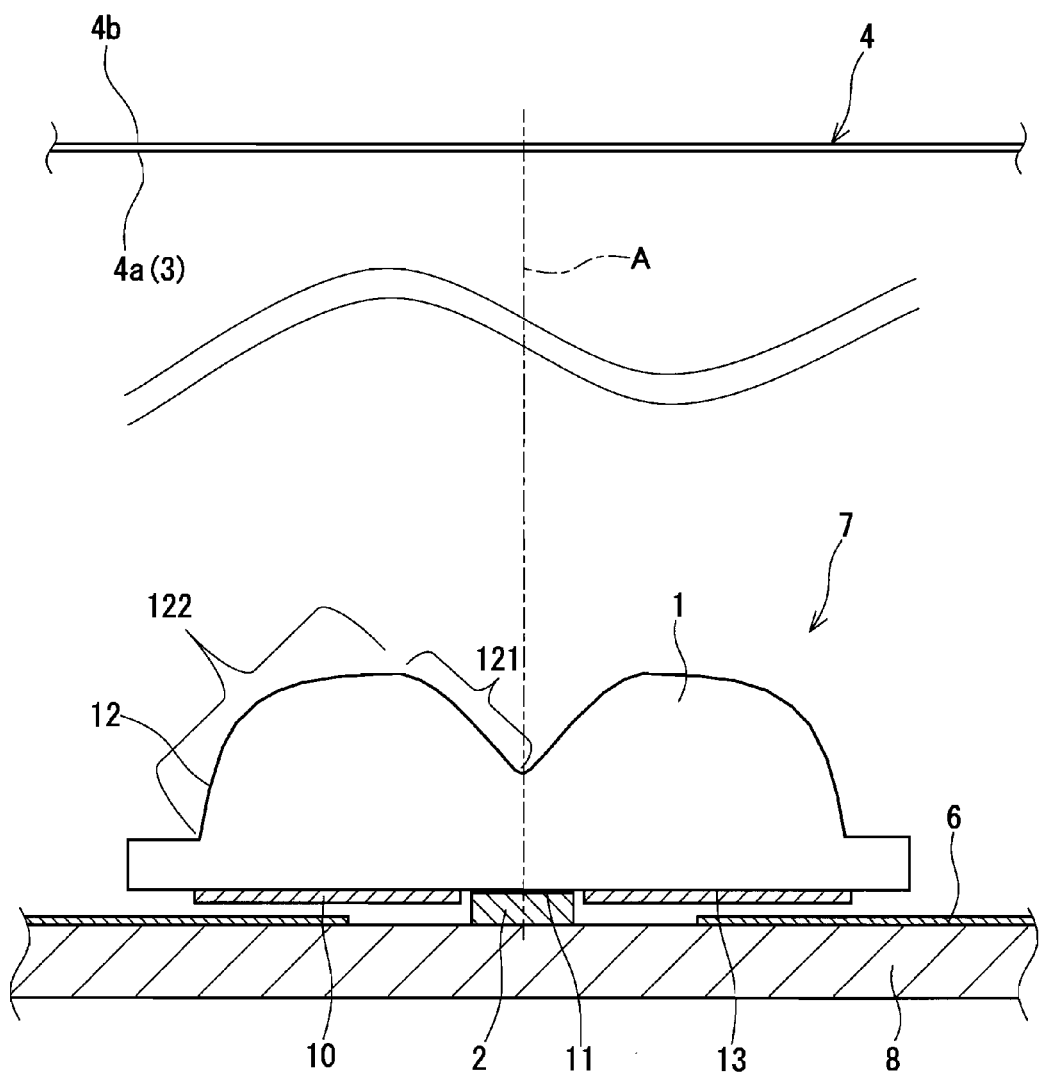
FIG. 19 is a partial cross-sectional view of the surface light source according to the third embodiment of the present invention.

The surface light source 9 includes a substrate 8 facing the diffusing plate 4 with the lighting devices 7 being disposed therebetween. As shown in FIG. 19, the light emitting diode 2 of each lighting device 7 is mounted on the substrate 8. In the present embodiment, a reflecting plate 6 is disposed on the substrate 8 to cover the substrate 8 with the light emitting diodes 2 being exposed.

The lighting device 7 emits light to one surface 4a of the diffusing plate 4. That is, the one surface 4a of the diffusing plate 4 is the surface to be irradiated 3 that has been described in the first and second embodiments. The diffusing plate 4 emits the light received on its one surface 4a from the other surface 4b in a diffused manner. The lighting devices 7 emit light individually toward a large area of the one surface 4a of the diffusing plate 4 so that the one surface 4a has a uniform illuminance, and upon receiving this light, the diffusing plate 4 emits the light diffusely. As a result, the surface light source capable of emitting light having less uneven brightness in the plane is obtained.

The light emitted from the lighting device 7 is diffused by the diffusing plate 4 so that the diffuse light returns to the lighting device side or passes through the diffusing plate 4. The light that has returned to the lighting device side and struck the reflecting plate 6 is reflected at the reflecting plate 6 and again enters the diffusing plate 4.

Figure 20:
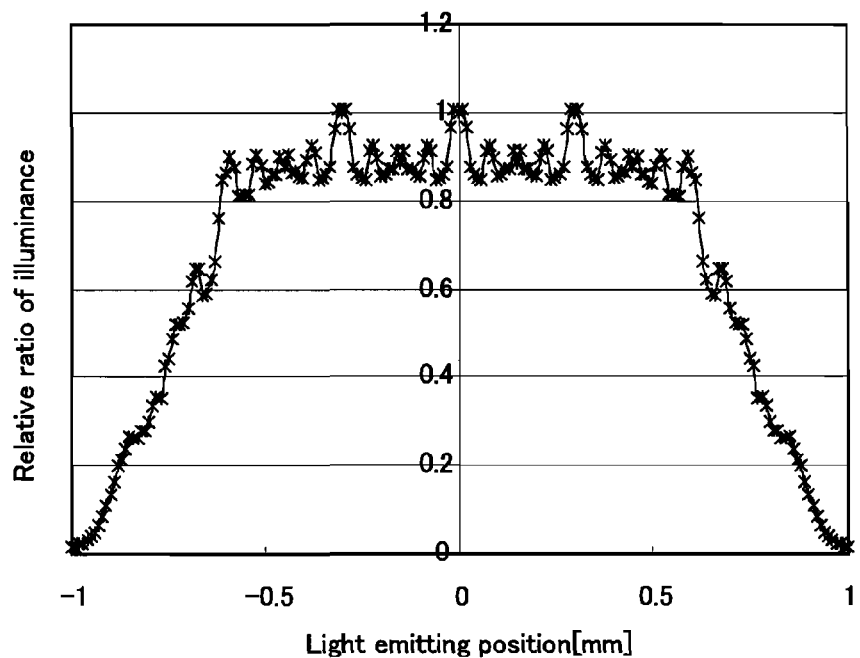
FIG. 20 shows an illuminance distribution obtained when the lighting device of Example 1 is used in the surface light source according to the third embodiment of the present invention.
Figure 21:
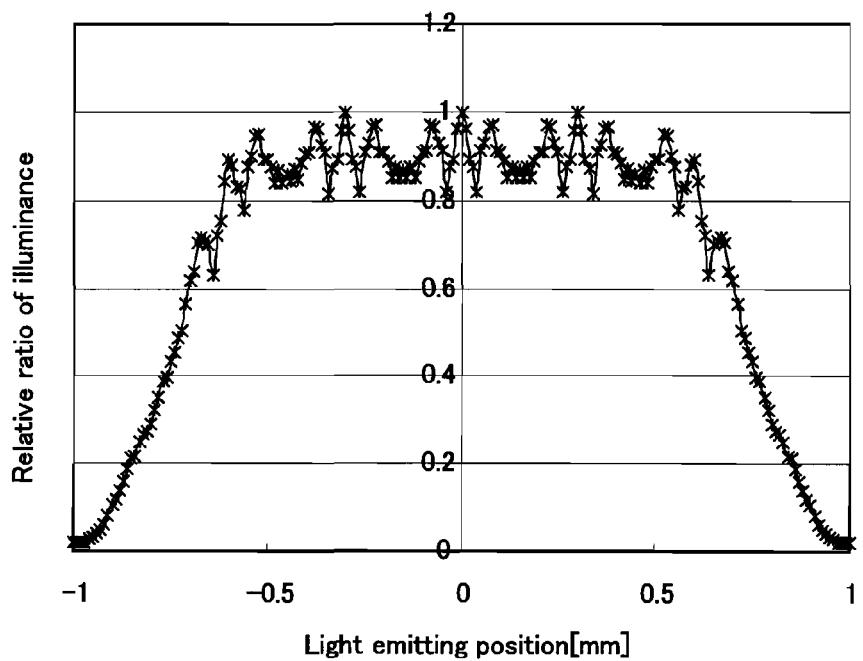
FIG. 21 shows an illuminance distribution obtained when the lighting device of Example 2 is used in the surface light source according to the third embodiment of the present invention.
Figure 22:
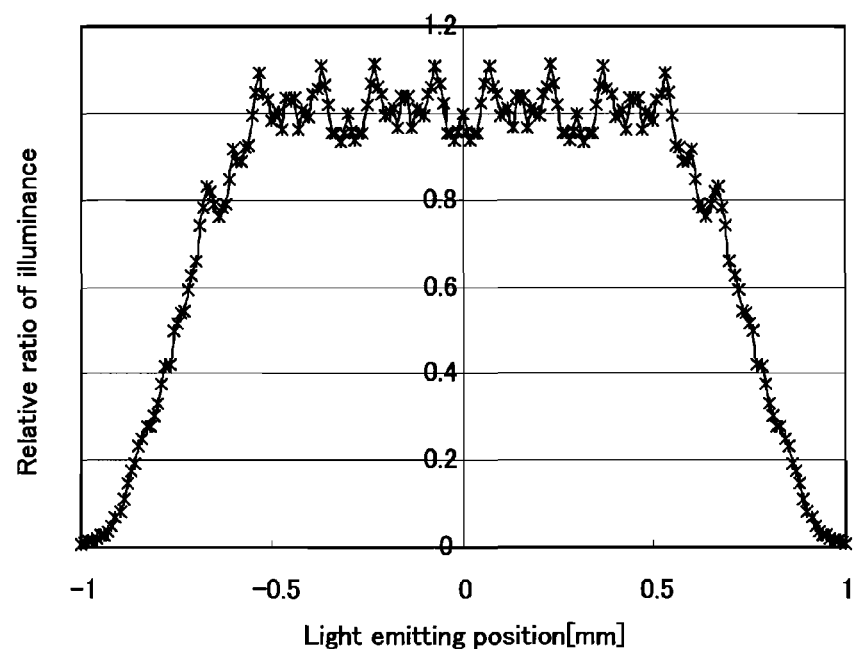
FIG. 22 shows an illuminance distribution obtained when the lighting device of Example 3 is used in the surface light source according to the third embodiment of the present invention.

FIG. 20 shows the illuminance distribution on the light entrance surface (one surface on the side of the lighting device) of the diffusing plate obtained by calculation assuming that five lighting devices of Example 1 each including the illuminating lens in FIG. 8 and the light emitting diode are arranged in a line at a pitch of 60 mm and the diffusing plate is placed at a distance of 16.4 mm from the light emitting diodes. Small fluctuations in the illuminance distribution are attributed to a small number of light rays to be evaluated in calculating the illuminances. FIG. 21 and FIG. 22 show the illuminance distribution obtained in the same manner when the lighting devices of Example 2 are used and the illuminance distribution obtained when the lighting devices of Example 3 are used, respectively.

Figure 23:
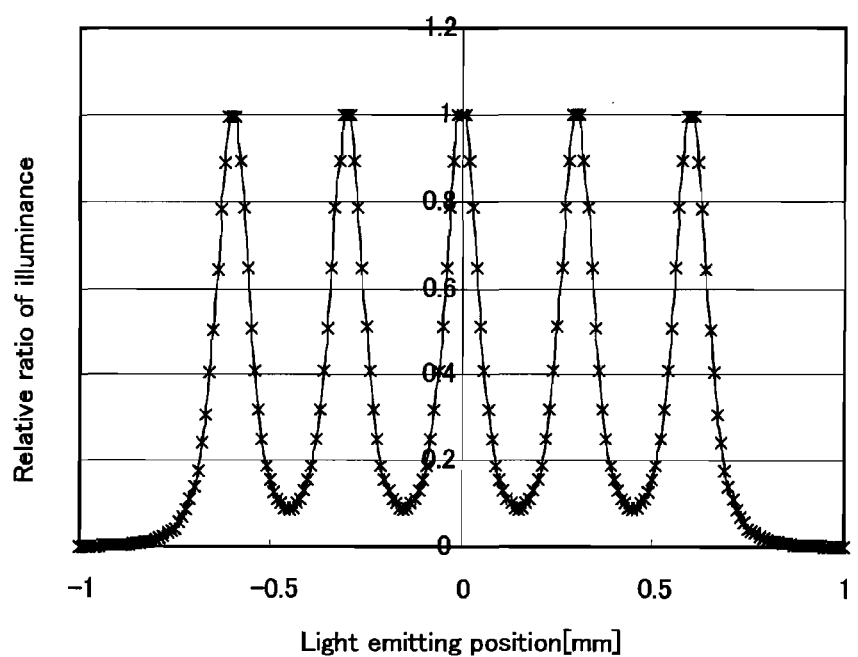
FIG. 23 shows an illuminance distribution obtained when a surface light source including lighting devices each composed of only a light emitting diode is used to confirm the effects of Examples 1 to 3.

FIG. 23 shows the illuminance distribution on the light entrance surface of the diffusing plate obtained by calculation assuming that five light emitting diodes only are arranged in a line with a pitch of 60 mm and the diffusing plate is placed at a distance of 16.4 mm from the light emitting diodes.

A comparison between FIGS. 20 to 22 and FIG. 23 shows that the illuminating lens is effective in illuminating the light entrance surface of the diffusing plate uniformly.

Fourth Embodiment

Figure 24:
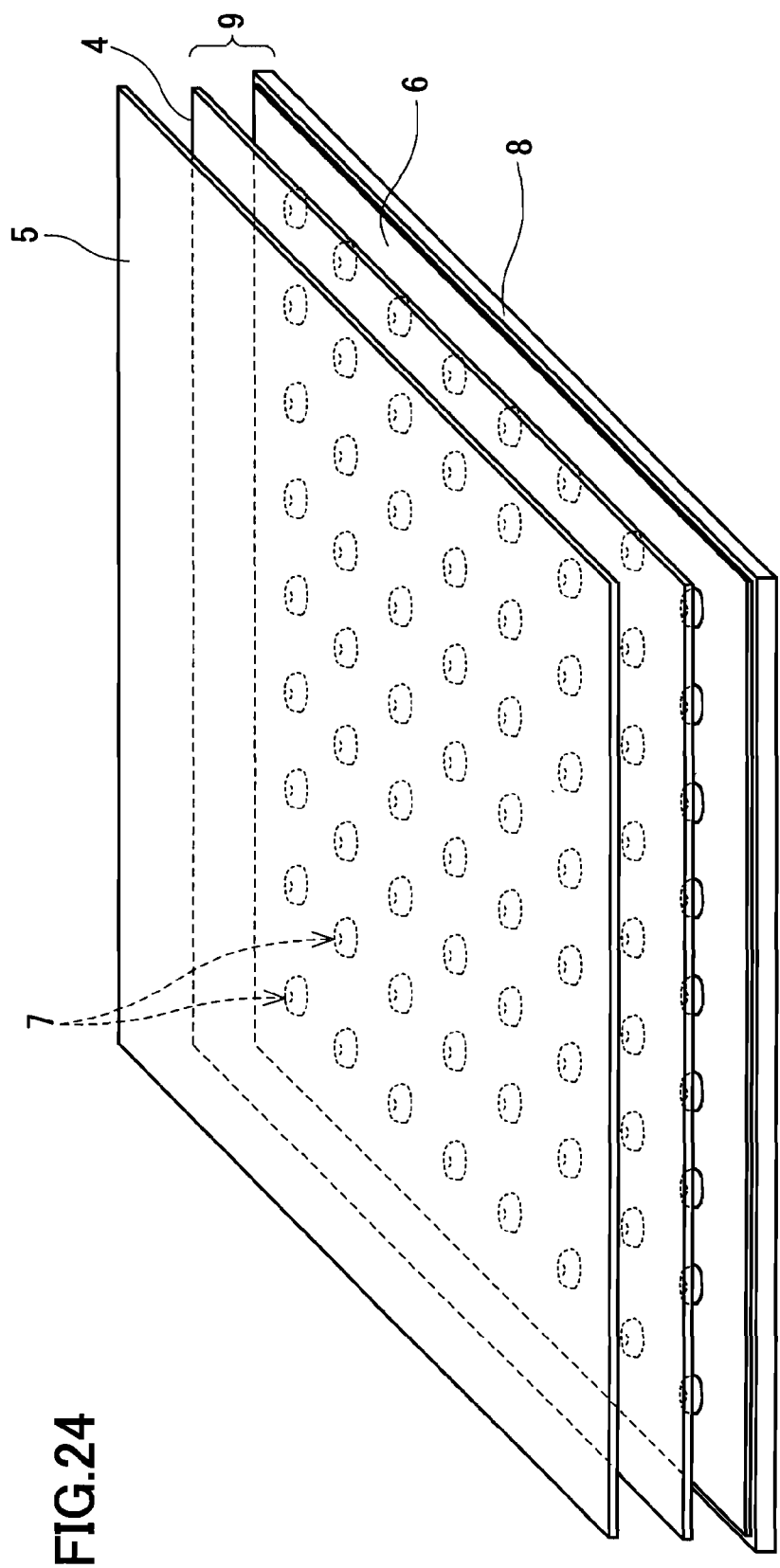
FIG. 24 is a schematic diagram of a liquid-crystal display apparatus according to a fourth embodiment of the present invention.

FIG. 24 is a schematic diagram of a liquid-crystal display apparatus according to a fourth embodiment of the present invention. This liquid-crystal display apparatus includes a liquid-crystal panel 5, and a surface light source 9 of the third embodiment disposed behind the liquid-crystal panel 5.

A plurality of lighting devices 7 each including the light emitting diode 2 and the illuminating lens 1 are arranged in a plane, and the diffusing plate 4 is illuminated by these lighting devices 7. The underside (one surface) of the diffusing plate 4 is irradiated with the light emitted from the lighting devices 7 to have a uniform illuminance, and then the light is diffused by the diffusing plate 4. Thus, the liquid-crystal panel 5 is illuminated by the diffused light.

It is preferable that an optical sheet such as a diffusing sheet or a prism sheet is disposed between the liquid-crystal panel 5 and the surface light source 9. In this case, the light that has passed through the diffusing plate 4 further is diffused by the optical sheet and illuminates the liquid-crystal panel 5.

The invention may be embodied in other forms without departing from the spirit or essential characteristics thereof. The embodiments disclosed in this specification are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. An illuminating lens for spreading light emitted from a light source so that a surface to be irradiated is irradiated with the spread light, the lens comprising:
   a light entrance surface through which the light emitted from the light source enters the lens;
   a light exit surface through which the light that has entered the lens exits the lens; and
   a bottom surface configured to surround the light entrance surface and to face oppositely to the light exit surface,
   wherein the light exit surface has a first light exit surface and a second light exit surface, the first light exit surface being recessed toward a point on an optical axis of the illuminating lens, and the second light exit surface extending outwardly from a periphery of the first light exit surface to form a convex surface,
   the first light exit surface has a transmissive region located in the center of the first light exit surface and a total reflection region located around the transmissive region, the transmissive region being capable of transmitting light that has been emitted from a starting point at a relatively small angle with respect to the optical axis and then reached the first light exit surface, when a position of the light source on the optical axis is defined as the starting point, and the total reflection region being capable of totally reflecting light that has been emitted from the starting point at a relatively large angle with respect to the optical axis and then reached the first light exit surface,
   the second light exit surface faces toward the surface to be irradiated,
   the second light exit surface has a shape capable of transmitting approximately the entire amount of light that has been emitted from the starting point and then directly reached the second light exit surface, and of totally reflecting approximately the entire amount of the light that has been totally reflected at the total reflection region and then reached the second light exit surface, and
   a reflective layer is formed on the bottom surface to reflect light that has been emitted from the light source, totally reflected repeatedly at the light exit surface, and then reached the bottom surface.

2. The illuminating lens according to claim 1, wherein the light exit surface is axisymmetric with respect to the optical axis.

3. The illuminating lens according to claim 1, wherein
   the bottom surface is flat, and
   the reflective layer has a ring shape extending radially outwardly from the optical axis, and satisfies the following inequalities:

$$R_{LS}/R < R_{in}/R < 0.78$$

$$0.75 < R_{out}/R$$

where $R_{in}$ is an internal radius of the reflective layer, $R_{out}$ is an outer radius of the reflective layer, $R_{LS}$ is a radius of a smallest circle circumscribing the light source, and R is an outermost radius of the illuminating lens.

4. The illuminating lens according to claim 1, wherein the reflective layer has a reflectance of at least 65%.

5. The illuminating lens according to claim 1, wherein the reflective layer reflects diffusely the light that has reached the bottom surface.

6. The illuminating lens according to claim 1, wherein the entire second light exit surface transmits the light that has been emitted from the starting point.

7. The illuminating lens according to claim 1, wherein the second light exit surface totally reflects a part of the light that has been emitted from the starting point and then directly reached the second light exit surface and transmits the remaining part of the light.

8. A lighting device comprising:
   a light emitting diode for emitting light; and
   an illuminating lens for spreading light emitted from the light emitting diode so that a surface to be irradiated is irradiated with the spread light,
   wherein the illuminating lens is the illuminating lens according to claim 1.

9. A surface light source comprising:
   a plurality of lighting devices arranged in a plane; and
   a diffusing plate disposed to cover the plurality of lighting devices, the diffusing plate being configured to receive on one surface thereof light emitted from the plurality of lighting devices and to emit the light from the other surface thereof in a diffused manner,
   wherein each of the plurality of lighting devices is the lighting device according to claim 8.

10. The surface light source according to claim 9, further comprising:
    a substrate on which the light emitting diode included in each of the plurality of lighting devices is mounted, the substrate facing the diffusing plate with the plurality of lighting devices being disposed therebetween; and
    a reflecting plate disposed on the substrate to cover the substrate with the light emitting diodes being exposed.

11. A liquid-crystal display apparatus comprising:
    a liquid-crystal panel; and
    the surface light source according to claim 9 disposed behind the liquid-crystal panel.

12. The illuminating lens according to claim 1, wherein:
    the light entrance surface having a recess formed toward the light exit surface at the optical axis of the illuminating lens; and
    the light source is configured to be disposed into the recess of the light entrance surface.

13. The lighting device according to claim 8, wherein an air space is provided between the light emitting diode and the light entrance surface such that the light emitting diode does not directly contact the light entrance surface.

14. The illuminating lens according to claim 1, wherein the reflective layer is disposed such that it is not irradiated by light which is directly emitted by the light source.

* * * * *